(12) United States Patent
Armgarth et al.

(10) Patent No.: US 7,679,110 B2
(45) Date of Patent: Mar. 16, 2010

(54) ELECTROCHEMICAL DEVICE AND METHODS FOR PRODUCING THE SAME

(75) Inventors: Marten Armgarth, Linköping (SE); Miaioxiang M. Chen, Kista (SE); David A. Nilsson, Vikingstad (SE); Rolf M. Berggren, Vreta Kloster (SE); Thomas Kugler, Cambridge (GB); Tommi M. Remonen, Nyköping (SE); Robert Forchheimer, Linköping (SE)

(73) Assignee: ACREO AB, Kista (SE)

( * ) Notice: Subject to any disclaimer, the term of this patent is extended or adjusted under 35 U.S.C. 154(b) by 277 days.

(21) Appl. No.: 11/980,633

(22) Filed: Oct. 31, 2007

(65) Prior Publication Data

US 2008/0128687 A1 Jun. 5, 2008

Related U.S. Application Data

(60) Division of application No. 11/327,438, filed on Jan. 9, 2006, now Pat. No. 7,582,895, which is a continuation of application No. 10/819,306, filed on Apr. 7, 2004, now Pat. No. 7,012,306, which is a continuation-in-part of application No. 10/091,419, filed on Mar. 7, 2002, now Pat. No. 6,806,511.

(60) Provisional application No. 60/276,218, filed on Mar. 16, 2001.

(30) Foreign Application Priority Data

Mar. 7, 2001 (SE) ..................................... 0100748

(51) Int. Cl.
*H01L 29/00* (2006.01)
(52) U.S. Cl. .............................. 257/253; 257/E19.166; 257/40

(58) Field of Classification Search ......... 257/414–416, 257/40, E29.166, 253; 438/48–49
See application file for complete search history.

(56) References Cited

U.S. PATENT DOCUMENTS 4,764,415 A 8/1988 Isoda et al.

(Continued)

FOREIGN PATENT DOCUMENTS

EP 0418504 3/1991

(Continued)

OTHER PUBLICATIONS

Kaneto, Keiichi et al.: "Memory Device Using a Conducting Polymer and Solid Polymer Electrolyte", Japanese Journal of Applied Physics, vol. 30, No. 2A, Feb. 1991, pp. L215-L217.

(Continued)

*Primary Examiner*—Nathan W Ha
(74) *Attorney, Agent, or Firm*—Harness, Dickey & Pierce, P.L.C.

(57) ABSTRACT

Methods of producing electrochemical transistor devices are provided, wherein a solidified electrolyte is arranged in direct contact with at least a portion of an organic material having the ability to electrochemically altering its electrical conductivity through change of redox state thereof, such that a current between a source contact and a drain contact of the transistor is controllable by way of a voltage applied to a gate electrode. A electrochemical transistor device is also provided, wherein an ion isolative material is provided between a solidified electrolyte and an organic material having ability to electrochemically altering its redox state, such that a transistor channel of the transistor is defined thereby.

27 Claims, 29 Drawing Sheets

U.S. PATENT DOCUMENTS

| | | | |
|---|---|---|---|
| 4,936,956 | A | 6/1990 | Wrighton |
| 5,300,575 | A | 4/1994 | Jonas et al. |
| 5,347,144 | A | 9/1994 | Garnier et al. |
| 5,770,803 | A | 6/1998 | Saito |
| 6,207,034 | B1 | 3/2001 | Madden et al. |
| 6,255,678 | B1 * | 7/2001 | Sawada et al. .............. 257/253 |
| 6,326,229 | B1 * | 12/2001 | Mastromatteo et al. ....... 438/49 |
| 6,387,724 | B1 * | 5/2002 | Walker ........................ 438/49 |
| 6,444,400 | B1 | 9/2002 | Cloots et al. |
| 6,670,686 | B2 | 12/2003 | Jaouen et al. |
| 7,023,065 | B2 | 4/2006 | Ayazi et al. |
| 2002/0053320 | A1 | 5/2002 | Duthaler et al. |
| 2002/0158295 | A1 | 10/2002 | Armgarth et al. |

FOREIGN PATENT DOCUMENTS

| | | |
|---|---|---|
| EP | 01 041 653 | 10/2000 |
| SE | 517 720 | 2/1998 |
| WO | WO 89/04061 | 5/1989 |
| WO | WO 99/10939 | 3/1999 |

OTHER PUBLICATIONS

W. Kobel et al., "Generation of Micropatterns in Poly(3-Methyl-Thiophene) Films using Microlithography: A First Step in the Design of an All-Organic Thin-Film Transistor," (Jan. 1988), pp. 265-271, Elsevier Sequoia, Lausanne, CH.

Chao et al. "Characterization of a "Solid-State" Polyaniline-Based Transistor: Water Vapor Dependent Characteristics of a Device Employing a Poly(vinyl alcohol)/Phosphoric Acid Solid-State Electrolyte," J. Am Chem. Soc., 1987, pp. 6627 to 6631, vol. 109, American Chemical Society, Washington, D.C., USA.

R.H. Baughman et al. "Application of Dopant-Induced Structure-Property Changes of Conducting Polymers," Science and Applications of Conducting Polymers, Proceedings of the Sixth Europhysics Industrial Workshop held in Lofthus Norway, May 1990, pp. 47-61.

V. Rani et al. "Polycarbazole-Based Electrochemical Transistor," J. Solid State Electrochem, vol. 2, No. 2, 1998, pp. 99 to 101, Abstract.

Kvarnstrom et al., "In Situ Spectroelectrochemical Characterization of Poly(3,4-Ethylendioxythiophene)", 1999, Electrochemica Acta, 44, pp. 2739 to 2750.

* cited by examiner

Fall time, $T_f$= 0.5s
Rise time, $T_r$=1.44s

Fall time, $T_f$= 0.1s
Rise time, $T_r$=2s

ELECTROCHEMICAL DEVICE AND METHODS FOR PRODUCING THE SAME

This is a divisional application of parent U.S. patent application Ser. No. 11/327,438, filed Jan. 9, 2006, which is a continuation of U.S. patent application Ser. No. 10/819,306, filed Apr. 7, 2004 (now U.S. Pat. No. 7,012,306), which in turn is a Continuation-in-Part of U.S. patent application Ser. No. 10/091,419 filed Mar. 7, 2002 (now U.S. Pat. No. 6,806,511), claiming the benefit under 35 U.S.C. §119(a)-(d) of Swedish Application No. 0100748-3, filed Mar. 7, 2001 and under 35 U.S.C. §119(e) of U.S. Provisional Application No. 60/276,218, filed Mar. 16, 2001, the entire contents of each of which are hereby incorporated herein by reference.

FIELD OF THE INVENTION

The present invention relates to electrochemical devices, in particular to printable, electrochemical transistor devices based on conducting organic materials and methods of producing such devices.

BACKGROUND OF THE INVENTION

Semiconducting and conducting organic materials, both polymers and molecules, have successfully been included in a large range of electronic devices, e.g. electrochemical devices, for instance as dynamic colorants in smart windows and in polymer batteries. Reversible doping and de-doping involving mobile ions switches the material between different redox states.

Use has been made of semiconducting polymers for the realization of field effect transistor (FET) devices. The transistor channel of these devices comprises the semiconducting polymer in question, and their function is based on changes in charge carrier characteristics in the semiconducting polymer, caused by an externally applied electric field. In such transistors, the polymer is used as a traditional semiconductor, in that the electric field merely redistributes charges within the polymer material. One such transistor has been realized, which is adapted for miniaturization and can be used for the production of integrated circuits consisting entirely of polymer material (PCT publication WO99/10939). A stack of sandwiched layers is described, with either a top-gate or a bottom-gate structure. A transistor device with a similar architecture, also using a polymer as semiconducting material in the channel of the transistor, is described in the European patent application EP1041653. Another type of transistor device based on organic materials utilizes electrochemical redox reactions in the organic material. These devices comprise an electrolyte and a conducting polymer that can be switched between an oxidized and a reduced state. One of these oxidation states then corresponds to low, preferably zero, conductivity in the material, whereas the other oxidation state corresponds to a high conductivity relative to the first state. Electrochemical transistor devices have been used as sensors, e.g. for detection of oxidant in a solution (see, for review, Baughman and Shacklette, Proceedings of the Sixth Europhysics Industrial Workshop (1990), p 47-61). Furthermore, a transistor of the electrochemical type is reported in Rani et al, J Solid State Electrochem (1998), vol 2, p 99-101. The gate electrode architecture in this prior art transistor is shown in FIG. 1 of this reference. Problems with electrochemical transistor devices of the prior art include the fact that they are difficult and expensive to manufacture. In particular, no electrochemical transistor devices have been disclosed which are capable of being mass-produced. Furthermore, the practical use of prior art electrochemical transistor devices has been hampered by their comparatively high power consumption. Furthermore, materials used in prior art devices suffer from a lack of environmental friendliness, processability and economic production possibilities. There is therefore a need for new and improved electrochemical transistor devices.

SUMMARY OF THE INVENTION

One of the objects of the present invention is then to meet this demand, by developing the art of electrochemical transistor devices, and by providing a device with handling, production, disposal and other characteristics superior to those of the prior art.

Another object of the present invention is to provide an electrochemical transistor device which can be deposited on a large range of different rigid or flexible substrates by conventional printing methods.

Yet another object of the present invention is to provide an environmentally safe electrochemical transistor device, so that the disposal of the device, along with any support onto which it has been deposited, doesn't give rise to handling problems, and so that no safety restrictions have to be imposed on the use of the device.

Still another object of the present invention is to make possible new applications of conducting organic materials, using several different properties of such materials in combination.

A further object of the invention is to provide processes for the production of such devices, which processes utilize conventional printing methods or other deposition techniques that are well known, relatively inexpensive and easily scaled up.

The aforementioned objects are met by an electrochemical transistor device as defined in the independent claims. Specific embodiments of the invention are defined in the dependent claims. In addition, the present invention has other advantages and features apparent from the detailed description below. Thus, an electrochemical transistor device is provided that comprises:

a source contact, a drain contact, an electrochemically active element arranged between, and in direct electrical contact with, the source and drain contacts, which electrochemically active element comprises a transistor channel and is of a material comprising an organic material having the ability of electrochemically altering its electrical conductivity through change of redox state thereof, at least one gate electrode that is separated from the electrochemically active element, and solidified electrolyte in direct electrical contact with the electrochemically active element, through a transistor channel interface having a spatial extension, and with the at least one gate electrode, wherein the transistor channel is defined by the spatial extension of said transistor channel interface, such that flow of electrons between source contact and drain contact is controllable by means of a voltage applied to said gate electrode(s).

The electrochemical transistor device allows for control of electron flow between source and drain contacts in that the conductivity of the transistor channel of the electrochemically active element can be modified, through altering of the redox state of the organic material therein. To provide for the necessary electrochemical reactions, whereby the conductivity in the transistor channel is changed, solidified electrolyte is arranged so that it is in direct electrical contact with both the transistor channel and the gate electrode(s). The electrochemical reaction is thus achieved by application of a voltage to the gate electrode(s), which generates an electric field in the electrolyte. In the contact area between electrolyte and electrochemically active element (i.e. at the transistor channel), electrochemical redox reactions take place, which change the conductivity of the organic material in the transistor channel. Either the organic material in the transistor channel is modified from a conducting state to a non-conducting state as a result of said redox reactions, or it is modified from a non-conducting to a conducting state, depending on the particular organic material used in the electrochemically active element.

A general advantage with the transistors according to the present invention is that they are capable of modulating very high currents and voltages. Voltages up to 70 V and currents up to 5 mA have been modulated without excessive device degradation. In fact, the electrochemically active element is experienced to withstand field-strengths reaching 1 MV/m. This fact makes the transistors very versatile for use in a number of high effect applications. For example, the transistor can be used for controlling light emitting diodes (LED:s), LED displays, liquid crystal displays, e-INK® displays etc.

In a sense, the transistor channel operates as a resistor that is switchable between low and high resistances. The absolute resistance values depend on the organic material used and on the structural design of the transistor channel, and the extreme values are obviously zero and infinite, respectively. The transistor channel is restricted to a portion of the electrochemically active element, such that portions of the electrochemically active element are electrically conductive regardless of the redox state in the transistor channel. Thereby the actual size, position, and design of the transistor channel is determined by the electrolyte. This is advantageous in that the electrochemically active element may be deposited with a low degree of precision, and only the electrolyte needs to be applied with a high degree of precision.

The position of the electrochemical transistor in a circuit may be critical for proper operation. This is especially true in case organic material is used as conductors in the circuitry, since the internal resistance in such conductors may affect the behaviour of the circuitry. However, positioning of the electrochemical transistor in accordance with the present invention is readily and accurately provided for by accurate positioning of the electrolyte. Consequently, the electrochemically active element need not have a very accurate position and it is therefore possible to apply the electrochemically active element with a relatively low spatial accuracy. This also facilitates tuning of the transistor characteristics by selecting an appropriate shape for the electrolyte interface. The transistor channel may, for example, be given a triangular shape or a saw-toothed shape.

However, in one embodiment, the transistor channel should occupy the entire cross-section of the connection between the drain and source contacts in order to limit current leakage between the respective contacts. Based on the electrochemical transistor described above it is possible to arrange semifinished circuitries that carry a number of potential transistors. Such a semifinished product can provide for a number of different "potential" circuitries, and a desired circuitry layout may be selected from the potential circuitries by activating the relevant transistor(-s). Activation is carried out by applying electrolyte that interface the relevant electrochemically active element(-s) while leaving the remaining active elements open.

The electrolyte may be applied selectively on the device, using for example a printing technique. An alternative approach, however, is to apply a layer of ion isolative material on top of the electrochemically active element, except for an open area where the transistor interface is to be arranged. Thereafter the electrolyte may be deposited with a low degree of precision, since the transistor interface, and thus the transistor channel, will anyway be defined as the open area in the layer of ion isolative material. The layer of ion isolative material may in fact be arranged to cover the entire device, except for areas where electrolyte is suppose to have direct electrical contact with the device (e.g. the gate electrodes).

Furthermore, the electrolyte may be arranged as one homogenous element, or as a number of separate elements not having ionic contact with each other. According to one embodiment, a continuous or interrupted layer of said solidified electrolyte covers the transistor channel and covers at least partially said gate electrode(s).

When a voltage is applied to the gate electrode(s), a redox reaction occurs in the transistor channel. This redox reaction is located to the area of the electrochemically active material that is covered with electrolyte, but also tends to migrate somewhat outside that area. Hence, the transistor channel is defined by the transistor interface but not necessarily confined to that very area only. The migration is more severe in case the electrochemically active element is formed out of a material that tends to conduct ions to some extent, such as PEDOT:PSS.

However, migration of the redox reaction outside the area that is in contact with electrolyte may be disadvantageous since it tends to slow down the switching of the transistor. One reason for this is that redox reactions in material that is not in close contact with the electrolyte is typically slow to reverse. Therefore, according to one embodiment, a "stopping material" is arranged that delimit the transistor channel from the surrounding electrochemically active element/material.

The stopping material may be a material that is electrically conductive but ionically non-conductive, or it may be a material that is electrochemically non-active at the voltages used. Alternatively it may be a material or material combination that has a different electrochemical potential than the electrochemically active material residing in the transistor channel. Materials combining some or all of these effects are also contemplated. The stopping material may actually be the same material as in the transistor channel but slightly modified to render it less ion-conducting, electrochemically non-active, or to alter its electrochemical potential. These effects or combinations of them can be exploited using any known method.

The stopping material may be arranged to delimit the transistor channel towards the source contact, the drain contact, and/or towards gate electrode(s).

The architecture of the electrochemical transistor device according to the invention is advantageous in that it makes possible the realization of a layered transistor device with only a few layers, having for example one patterned layer of material comprising a conducting organic material, which layer comprises source and drain contacts and gate electrode(s), as well as the electrochemically active element. The source and drain contacts and the electrochemically active element are then preferably formed by one continuous piece of said material. The source and drain contacts could alternatively be formed from another electrically conducting material in direct electrical contact with the electrochemically active element. The gate electrode(s) may also be of another electrically conducting material. However, a particular advantage in the electrochemical transistor is that the gate electrode(s), the source and drain contacts, and the transistor channel can be formed out of one and the same organic material. Furthermore, this organic material can be used not only for the transistor as such. Rather, the same organic material, and hence also the same manufacturing step (e.g. a printing step) can provide for connector strips and possibly also other type of electrical components. Resistors is one example of such a component, which may be formed out of a organic material conductor path having a length and cross-section that provide for the desired resistance.

Thus, according to one embodiment, at least one of the source and drain contacts and the gate electrode(s) is formed from the same material as the electrochemically active element. Obviously, in yet one embodiment, all of the source and drain contacts and the gate electrode(s) are formed from the same material as the electrochemically active element.

In case source and/or drain contacts are formed out of an organic material, there might not exist any distinct delimiter between these components and the electrochemically active element. In some embodiments all these three components are actually formed out of a continuous piece of the same material. However, distinction between these components are not necessary for the purpose of the present invention. In some applications, the source and/or drain contacts are formed out of an organic material and are interconnected with other types of materials, e.g. metal stripes forming electrical conductors that interconnects the transistor with additional components. However, such conductors etc. need not form part of the transistor as such. When reference is made to a transistor, only the parts that is needed for proper operation of the device is intended. In other words, for example, a transistor having source, drain, gate, and electrochemically active material formed out of an organic material may very well be interconnected with metal conductors.

In a preferred embodiment, the source and drain contacts and gate electrode(s), as well as the active element, are all arranged to lie in a common plane, further simplifying production of the device by ordinary printing methods. Thus, the electrochemical device according to this embodiment uses a lateral device architecture. A layer of solidified electrolyte can advantageously be deposited so that it covers, at least partly, the gate electrode(s) as well as covering the transistor cannel. This layer of solidified electrolyte may be continuous or interrupted, depending partly on which of two main types of transistor architectures is to be realized (see below). The layout of the interface between the electrolyte and the transistor channel, i.e. the transistor interface, will determine the shape and position of the transistor channel.

According to an alternative embodiment, the electrochemical transistor may have a vertical structure. In such case the source and drain contacts and the electrochemically active element are arranged in one common plane, and solidified electrolyte and one gate electrode are sandwiched on the electrochemically active element.

In the transistor, the electrochemical reaction is driven by the existence of a potential difference between the electrolyte and the electrochemically active material. For many applications, it is preferable to have an as even spread as possible of the redox reaction in the electrochemically active element. Vertical structures generally provide for a more evenly spread of the redox reaction. This is due to the fact that, in a vertical structure, the potential gradient is much steeper in the vertical direction than in the lateral direction. This is opposed to lateral structures wherein the potential gradient typically is much steeper in the lateral direction. Or, in other words, the redox reaction in the electrochemically active element grows from the gate electrode direction of the electrochemically active element (i.e. from the side of the element in a lateral structure and from the top of the element in a vertical structure). Advantages of vertical structures further include a more compact design and possibly also a more rapid electrochemical response (since the ion current in the electrolyte need only travel vertically across the thickness of the solidified electrolyte). Hence, transistors having vertical and lateral structures can be made to have different time dependant switching characteristics. Naturally, it is possible to combine vertical and lateral transistors in a circuitry, for example in case transistors operating on different time-scales are desired. As is readily appreciated by the skilled person, and in analogy to conventional field effect transistors, the electrochemical transistor device of the invention may readily be made to function as a diode device through short-circuiting of the gate electrode and source contact, or of the gate electrode and drain contact. One non-limiting example of this is described in the description below. However, any configuration of the electrochemical transistor device may naturally be used as a diode in this fashion.

Depending on the precise patterning of the conducting organic material and the electrolyte, the electrochemical transistor device of the invention can either be of a bi-stable or a dynamic type. In the bi-stable transistor embodiment, a voltage applied to the gate electrode(s) leads to a change in conductivity in the transistor channel that is maintained when the external circuit is broken, i.e. when the applied voltage is removed. The electrochemical reactions induced by the applied voltage can not be reversed, since the electrochemically active element and the gate electrode(s) are not in direct electrical contact with each other, but separated by electrolyte. In this embodiment, the transistor channel can be switched between non-conducting and conducting states using only small, transient gate voltages. The bi-stable transistor can be kept in an induced redox state for days, and, in the most preferred, ideal case, indefinitely.

Thus, the bi-stable transistor embodiment of the present invention offers a memory function, in that it is possible to switch it on or off using only a short voltage pulse applied to the gate electrode. The transistor stays in the conducting or non-conducting redox state even after the applied voltage has been removed. A further advantage with such bi-stable transistors is that close to zero-power operation is made possible, since the short voltage pulses applied to the gate need not be larger than a fraction of the gate voltages needed for operation of a corresponding dynamic device. In the dynamic transistor embodiment, the change in the redox state of the material is reversed spontaneously upon withdrawal of the gate voltage. This reversal is obtained through the provision of a redox sink volume adjacent to the transistor channel in the electrochemically active element. Also, a second gate electrode is provided, and arranged so that the two gate electrodes are positioned on either side of the electrochemically active element, one closer to the transistor channel, and the other closer to the redox sink volume. Both gate electrodes are separated from the electrochemically active element by electrolyte. Application of a voltage between the two gate electrodes results in the electrochemically active element being polarized, whereby redox reactions take place in which the organic material in the transistor channel is reduced while the organic material in the redox sink volume is oxidized, or vice versa. Since the transistor channel and the redox sink volume are in direct electrical contact with each other, withdrawal of gate voltage leads to a spontaneous reversal of the redox reactions, so that the initial conductivity of the transistor channel is re-established. It is to be stressed that in contrast to electrochemical transistors of the prior art, dynamic transistors according to this embodiment of the present invention revert spontaneously to the initial conductivity state without the need for a reversing bias.

The electrochemical transistor device according to the invention is also particularly advantageous in that it can be easily realized on a support, such as polymer film or paper. Thus, the different components can be deposited on the support by means of conventional printing techniques such as screen printing, offset printing, gravure printing, ink-jet printing and flexographic printing, or coating techniques such as knife coating, doctor blade coating, extrusion coating and curtain coating, such as described in "Modern Coating and Drying Technology" (1992), eds E D Cohen and E B Gutoff, VCH Publishers Inc, New York, N.Y., USA. In those embodiments of the invention that utilize a conducting polymer as the organic material (see below for materials specifications), this material can also be deposited through in situ polymerization by methods such as electropolymerization, UV-polymerization, thermal polymerization and chemical polymerization. As an alternative to these additive techniques for patterning of the components, it is also possible to use subtractive techniques, such as local destruction of material through chemical or gas etching, by mechanical means such as scratching, scoring, scraping or milling, or by any other subtractive methods known in the art. An aspect of the invention provides such processes for the manufacture of an electrochemical transistor device from the materials specified herein. However, the invention is not limited to supported devices, as the contacts and electrode(s), electrochemically active element and electrolyte can be arranged in such a way that they support each other. An embodiment of the invention thus provides for a self-supporting device.

According to a preferred embodiment of the invention, the electrochemical transistor device is encapsulated, in part or entirely, for protection of the device. The encapsulation retains any solvent needed for e.g. the solidified electrolyte to function, and also keeps oxygen from disturbing the electrochemical reactions in the device. Encapsulation can be achieved through liquid phase processes. Thus, a liquid phase polymer or organic monomer can be deposited on the device using methods such as spray-coating, dip-coating or any of the conventional printing techniques listed above. After deposition, the encapsulant can be hardened for example by ultraviolet or infrared irradiation, by solvent evaporation, by cooling or through the use of a two-component system, such as an epoxy glue, where the components are mixed together directly prior to deposition. Alternatively, the encapsulation is achieved through lamination of a solid film onto the electrochemical transistor device. In preferred embodiments of the invention, in which the components of the electrochemical transistor device are arranged on a support, this support can function as the bottom encapsulant. In this case encapsulation is made more convenient in that only the top of the sheet needs to be covered with liquid phase encapsulant or laminated with solid film.

The electrochemical transistor can be used in many different applications, and may readily be arranged as component in a circuit. The transistors described above typically carries one or two separate gate electrodes in addition to the source electrode and the drain electrode. However, in circuit design it is important to have a reference point for the potential. Or, in other words, the gate potential may not float in relation to the drain/source potentials. Therefore, transistors having only one gate electrode is found particularly useful for many circuitry applications. In these transistors, either source or drain is used as reference potential for the gate electrode thereby avoiding any floating gate potential. It is also possible to design transistors that have two or more gate electrodes that all are referenced to source or drain and that thus eliminates any floating potential. Such transistors may be advantageous for certain applications, since the gate electrodes can be arranged so as to provide a better potential gradient distribution in the transistor channel (e.g. a more even spread and possibly higher speed of the redox reaction in the channel).

Thus, according to one embodiment, the transistor device is arranged such that flow of electrons between source contact and drain contact is controllable by means of a voltage applied between said gate electrode(s) and one of the source contact and the drain contact.

In case the transistor channel is electrically conductive in its ground state, i.e. before any redox reaction, the transistor is "normally open" and closes upon application of a gate voltage. In case the transistor channel is electrically non-conductive (i.e. has a high resistance) in its ground state, the transistor is "normally closed" and opens upon application of a gate voltage. In analogy with traditional field effect transistors, "normally open" electrochemical transistors are said to operate in depletion mode and "normally closed" electrochemical transistors are said to operate in enhancement mode. An electrochemical transistor that is "normally closed" operates in the same manner as a traditional field effect transistor (i.e. application of a gate voltage opens the source— drain connection and provides for a source— drain current). Such transistors may be employed in circuits having traditional design.

However, as it turns out, many of the organic materials that have proven prosperous for use in the electrochemical transistor are such that they are electrically conductive in their ground state and have a lower electrical conductivity in their reduced state. This class of polymers includes, for example, PEDOT:PSS. This characteristic has implications on the transistors in that it will conduct current between the source and drain electrodes as long as no voltage is applied on the gate electrode(-s). Consequently, these electrochemical transistors are "normally open" and behave opposite to ordinary FET which transmits voltage between source and drain electrodes only when a voltage is applied to the gate electrode.

Depending on the organic material(s) used in the electrochemically active element, the voltage needed on the gate electrode to switch the transistor from its "normal" state may be positive or negative. Hence, there are four different "types" of transistors, depending on the organic materials used:

"normally open" that closes in response to a positive gate voltage (comp. P-doped depletion mode transistors)

"normally open" that closes in response to a negative gate voltage (comp. N-doped depletion mode transistors)

"normally closed" that opens in response to a negative gate voltage (comp. P-doped enhancement mode transistors)

"normally closed" that opens in response to a positive gate voltage (comp. N-doped enhancement mode transistors)

According to one embodiment, the organic material in the transistor channel is such that flow of electrons between source contact and drain contact is restrained upon application of a positive voltage to the gate electrode. According to an alternative embodiment the organic material in the transistor channel is such that flow of electrons between source contact and drain contact is promoted upon application of a positive voltage to the gate electrode.

The electrochemical transistor described above can be used for many different applications. An advantage is that the transistor can be formed out of the same material as conductors, resistors and capacitors, using the same manufacturing equipment (e.g. a printing technique). A resistor, for example, is readily provided in the form of a resistor path having a suitable length and cross-section. It is also possible to provide capacitors using organic material. On example is given in the article "All-polymer RC filter circuits fabricated with inkjet printing technology", Chen at el, Solid-State Electronics 47 (2003) 841-847.

Many basic circuits, such as inverters, AND, NAND, OR, and NOR operators, may be formed out of interconnected transistors and resistors. Hence, the present invention provides the hitherto missing part (i.e. the transistor) for making cheap, printable, and environmentally friendly circuitries that can be arranged on e.g. a flexible substrate such as a piece of paper.

Thus, according to another aspect of the invention, a circuitry comprising an electrochemical transistor as described above is provided. Obviously, the circuitry may comprise a number of equal or different electrochemical transistors.

In addition to one or more electrochemical transistors, the circuitry typically comprises at least one resistor component that may be formed out of an organic material. The organic material is preferably the same material as is used in the transistor(s), and it may also be used for forming electrical junctions between different components in the circuitry. The organic material may, for example, be one of PEDOT:PSS, polyaniline, and polypyrrole, or a combination thereof.

According to one embodiment, the circuitry comprises a resistor that has a predefined electrical resistance and that is formed out of a path of organic material having a S-shaped path pattern defining at least two essentially parallel path portions.

A resistor may alternatively be formed as an integrated component in an electrical junction. This can be achieved by suitable choice of length, width, and thickness of the junction. Hence, according to one embodiment, a resistor having a predefined electrical resistance forms a passive electrical component and operated also as a junction between to other electrical components in the circuitry.

In circuit design, as stated above, it is typically important to have a reference point for the potential. Therefore, according to a preferred embodiment, the gate potential is referenced to either of the source and the drain contacts. According to one embodiment, the transistor channel of the electrochemical transistor comprises an organic material that is electrically conductive in a ground state and that has a lower electrical conductivity in an electrochemically reduced state, and wherein, when the circuit is in operation, the gate potential is always at least as high as the drain potential. This rule of thumb implicates that the drain potential is never higher than the gate potential, or, in other words, that the gate potential must be at least as high as the desired drain potential. This design rule will ensure proper operation of electrochemical transistors wherein the electrochemically active material is electrically conductive in a ground state and has a lower electrical conductivity in an electrochemically reduced state.

A yet more stable design rule is to demand that the potential at the gate electrode should actually be at least as high as the potential at the source electrode. Obviously, the potential at the source electrode is thereby always at least as high as the potential at the drain electrode (and typically higher). Thus, according to one embodiment, the gate potential is always at least as high as the source potential, and the source potential is always at least as high as the drain potential.

The circuitry described above may, for example, be used as an analog operator or as a logic operator.

The above design rules are valid when using, for example, PEDOT:PSS in the form of Orgacon™ EL350 as organic material. However, materials (even other PEDOT:PSS formulations) having different characteristics may require different design rules. According to one embodiment, the circuitry is operative as a logic operator that takes as input voltages in a first range corresponding to a logical zero and a second range corresponding to a logical one, and that output voltages corresponding to said logical zero and logical one depending on the input.

The logical operator may, for example, be one of:
  a logic inverter and comprising a system of resistors which ensures that the output voltages correspond to one of said logical zero and said logical one,
  a logic inverter comprising a second electrochemical transistor that ensures that the output voltages correspond to one of said logical zero and said logical one.
  a logical AND, OR, NAND, or NOR operator, having wherein two electrochemical transistors connected in series or in parallel
  a comparator that takes a first input voltage and a second input voltage as inputs and that outputs a voltage in a range corresponding to a logical zero in case the first input voltage is lower than the second input voltage, and outputting a voltage in a range corresponding to a logical one in case the first input voltage is higher than the second input voltage.

As an example of analog operators, one embodiment of the circuitry provides an analogue amplifier, amplifying an input voltage and outputting an amplified output voltage.

According to another embodiment, the circuitry is operative as a constant current source, and the electrochemical transistor is employed to ensure that an output current is always within a prescribed current range provided that the load on the circuitry is within prescribed load range.

The invention will now be further described with reference to specific embodiments thereof and to specific materials. This detailed description is intended for purposes of exemplification, not for limitation in any way of the scope of the invention as claimed.

DETAILED DESCRIPTION OF PREFERRED EMBODIMENTS

Definitions

Figure 1A:
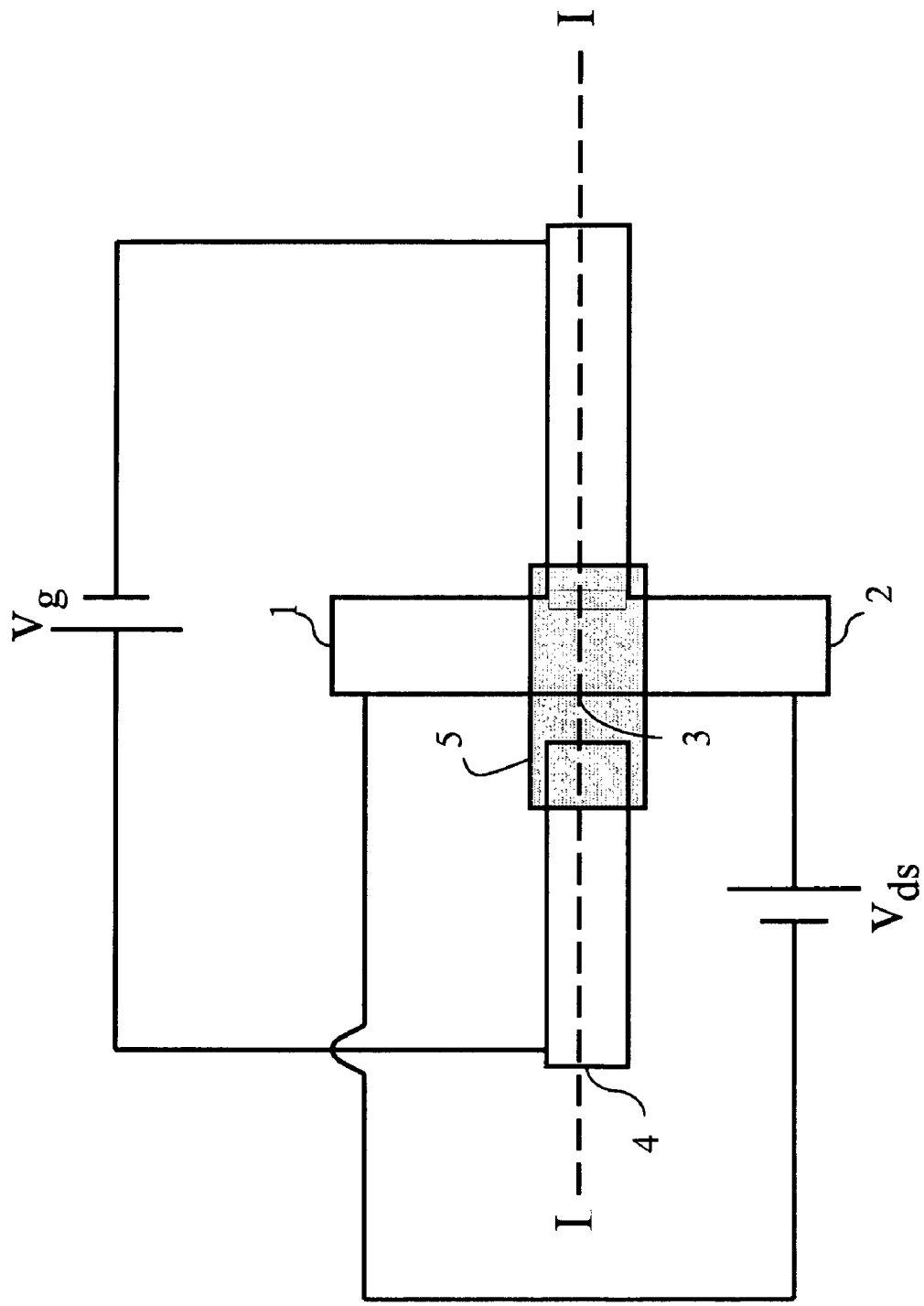
FIG. 1. Schematic structure of one embodiment of a bi-stable transistor according to one embodiment, showing (A) a top view, (B) a cross-section along I-I in A, and (C) a top view with a different position for application of Vg.

Bi-stable electrochemical transistor: an electrochemical transistor device in which the transistor channel retains its redox state (and hence its conductivity characteristics) when the gate voltage is removed.

Dynamic electrochemical transistor: an electrochemical transistor device in which the transistor channel spontaneously returns to its initial redox state (and hence to its initial conductivity characteristics) when the gate voltage is removed.

Source contact: an electrical contact which provides charge carriers to a transistor channel.

Drain contact: an electrical contact which accepts charge carriers from a transistor channel.

Gate electrode: an electrical contact of which any fraction of the surface area is in direct electrical contact with solidified electrolyte, and therefore in ionic contact with the electrochemically active element.

Electrochemically active element: an "electrochemically active element" according to the present invention, is a piece of a material comprising an organic material having a conductivity that can be electrochemically altered through changing of the redox state of said organic material. The electrochemically active element is in ionic contact with at least one gate electrode via a solidified electrolyte. The electrochemically active element may furthermore be integrated with each of the source and drain contacts individually or with both of them, being composed of the same or different materials. The electrochemically active element in the electrochemical transistor devices of the invention comprises a transistor channel, and may furthermore comprise a redox sink volume.

Transistor channel: the "transistor channel" of the electrochemically active element establishes electrical contact between source and drain contacts.

Redox sink volume: in certain embodiments of the invention, the electrochemically active element further comprises a "redox sink volume". This is a part of the electrochemically active element adjacent to and in direct electrical contact with the transistor channel, which can provide or accept electrons to or from the transistor channel. Thus, any redox reactions within the transistor channel are complemented by opposing reactions within the redox sink volume.

Redox state: when reference is made to changes in the "redox state" of the electrochemically active element, this is intended to include cases where the organic material in the electrochemically active element is either oxidized or reduced, as well as cases where there is a redistribution of charges within the electrochemically active element, so that one end (e.g. the transistor channel) is reduced and the other end (e.g. the redox sink volume) is oxidized. In the latter case, the electrochemically active element as a whole retains its overall redox state, but its redox state has nevertheless been changed according to the definition used herein, due to the internal redistribution of charge carriers. Direct electrical contact: Direct physical contact (common interface) between two phases (for example electrode and electrolyte) that allows for the exchange of charges through the interface. Charge exchange through the interface can comprise transfer of electrons between electrically conducting phases, transfer of ions between ionically conducting phases, or conversion between electronic current and ionic current by means of electrochemistry at an interface between for example electrode and electrolyte or electrolyte and electrochemically active element, or by occurrence of capacitive currents due to the charging of the Helmholtz layer at such an interface.

Solidified electrolyte: for the purposes of the invention, "solidified electrolyte" means an electrolyte, which at the temperatures at which it is used is sufficiently rigid that particles/flakes in the bulk therein are substantially immobilized by the high viscosity/rigidity of the electrolyte and that it doesn't flow or leak. In the preferred case, such an electrolyte has the proper rheological properties to allow for the ready application of this material on a support in an integral sheet or in a pattern, for example by conventional printing methods. After deposition, the electrolyte formulation should solidify upon evaporation of solvent or because of a chemical cross-linking reaction, brought about by additional chemical reagents or by physical effect, such as irradiation by ultraviolet, infrared or microwave radiation, cooling or any other such. The solidified electrolyte preferably comprises an aqueous or organic solvent-containing gel, such as gelatin or a polymeric gel. However, solid polymeric electrolytes are also contemplated and fall within the scope of the present invention. Furthermore, the definition also encompasses liquid electrolyte solutions soaked into, or in any other way hosted by, an appropriate matrix material, such as a paper, a fabric or a porous polymer. In some embodiments of the invention, this material is in fact the support upon which the electrochemical transistor device is arranged, so that the support forms an integral part of the operation of the device.

Materials

Preferably, the solidified electrolyte comprises a binder. It is preferred that this binder have gelling properties. The binder is preferably selected from the group consisting of gelatin, a gelatin derivative, polyacrylic acid, polymethacrylic acid, poly(vinylpyrrolidone), polysaccharides, polyacrylamides, polyurethanes, polypropylene oxides, polyethylene oxides, poly(styrene sulphonic acid) and poly (vinyl alcohol) and salts and copolymers thereof; and may optionally be cross-linked. The solidified electrolyte preferably further comprises an ionic salt, preferably magnesium sulphate if the binder employed is gelatin. The solidified electrolyte preferably further contains a hygroscopic salt such as magnesium chloride to maintain the water content therein.

The organic material for use in the present invention preferably comprises a polymer which is electrically conducting in at least one oxidation state and optionally further comprises a polyanion compound. Organic materials comprising combinations of more than one polymer material, such as polymer blends, or several layers of polymer materials, wherein the different layers consist of the same polymer or different polymers, are also contemplated. Conductive polymers for use in the electrochemical transistor device of the invention are preferably selected from the group consisting of polythiophenes, polypyrroles, polyanilines, polyisothianaphthalenes, polyphenylene vinylenes and copolymers thereof such as described by J C Gustafsson et al in Solid State Ionics, 69, 145-152 (1994); Handbook of Oligo- and Polythiophenes, Ch 10.8, Ed D Fichou, Wiley-VCH, Weinhem (1999); by P Schottland et al in Macromolecules, 33, 7051-7061 (2000); by M Onoda in Journal of the Electrochemical Society, 141, 338-341 (1994); by M Chandrasekar in Conducting Polymers, Fundamentals and Applications, a Practical Approach, Kluwer Academic Publishers, Boston (1999); and by A J Epstein et al in Macromol Chem, Macromol Symp,
51, 217-234 (1991). In an especially preferred embodiment, the organic material is a polymer or copolymer of a 3,4-dialkoxythiophene, in which said two alkoxy groups may be the same or different or together represent an optionally substituted oxy-alkylene-oxy bridge. In the most preferred embodiment, the polymer is a polymer or copolymer of a 3,4-dialkoxythiophene selected from the group consisting of poly(3,4-methylenedioxythiophene), poly(3,4-methylenedioxythiophene) derivatives, poly(3,4-ethylenedioxythiophene), poly(3,4-ethylenedioxythiophene) derivatives, poly(3,4-propylenedioxythiophene), poly(3,4-propylenedioxythiophene) derivatives, poly(3,4-butylenedioxythiophene), poly(3,4-butylenedioxythiophene) derivatives, and copolymers therewith. The polyanion compound is then preferably poly(styrene sulphonate).

The support in some embodiments of the electrochemical transistor device of the present invention is preferably selected from the group consisting of polyethylene terephthalate; polyethylene naphthalene dicarboxylate; polyethylene; polypropylene; paper; coated paper, e.g. coated with resins, polyethylene, or polypropylene; paper laminates; paperboard; corrugated board; glass and polycarbonate.

PEDOT:PSS can, in an electrochemical cell, be switched between a high conducting state (oxidized) and a low conducting state (reduced) according to the reaction below:

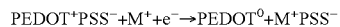

$$PEDOT^+PSS^- + M^+ + e^- \rightarrow PEDOT^0 + M^+PSS^-$$

The metal ion M+ is supplied by the electrolyte and the electron e− is transported by PEDOT. It is not only the conducting properties of PEDOT:PSS that is changed, also the optical properties are changed. PEDOT:PSS appears transparent in the oxidized state and deep blue in the reduced state. This implies possibilities to create electrochromic display elements out of the transistor, utilizing the color changes in the transistor channel when oxidized or reduced. PEDOT:PSS is coated on a polyester carrier, ORGACON™ EL-350 used as received by AGFA-GAEVART. The PEDOT:PSS film received is in a partially oxidized state (highly conducting state) which allows PEDOT to be further oxidized. At elevated oxidation potential PEDOT can be oxidized to a non-reversible non-conducting state, which we refer to as an over-oxidized state.

Principal Device Architectures

By patterning of the organic material of the electrochemically active element and of the contacts, electrode(s) and electrolyte in different ways, two main types of electrochemical transistor devices can be realized. These main types, bi-stable and dynamic electrochemical transistor devices, will now be exemplified along with reference to figures thereof and an outline of their working principles.

Figure 1B:
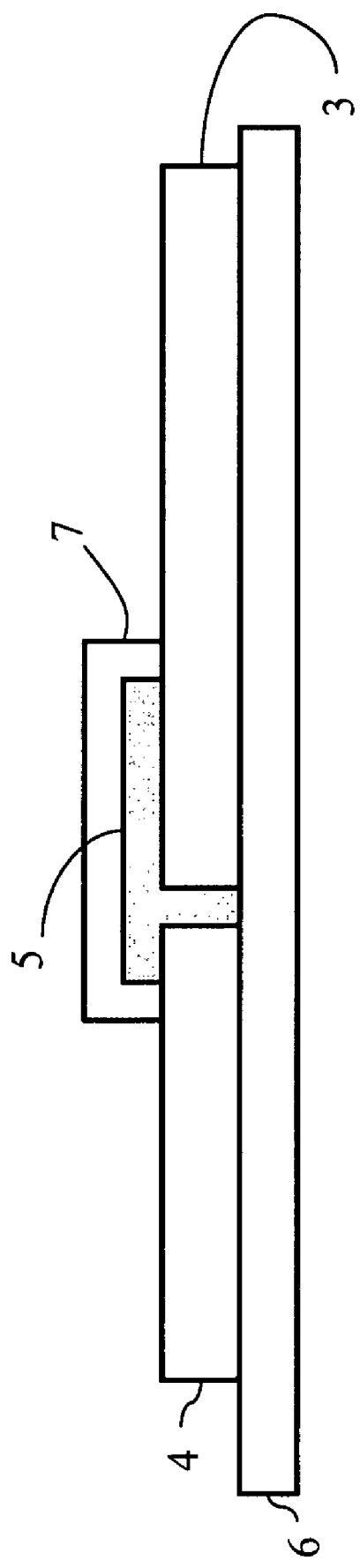

Bi-stable transistor (type 1): FIGS. 1A and 1B schematically show one embodiment of a bi-stable transistor. The transistor comprises a source contact 1, a drain contact 2 and an electrochemically active element 3, which have all been formed from a continuous piece of organic material. Both the source and drain contacts are in electrical contact with an external power source, which allows the application of a voltage Vds between them. The transistor further comprises a gate electrode 4, which can be formed from the same organic material as the source and drain contacts and the electrochemically active element. The gate electrode 4 is in electrical contact with an external power source, which allows applying a voltage Vg between the gate electrode and the electrochemically active element. This can be realized by applying Vg between the gate 4 and the source 1 or the drain 2, or directly between the gate 4 and the electrochemically active element 3. All of these organic material components have been deposited in one layer on a support 6. On top of this layer, covering part of the gate electrode 4 and the active element 3, is a layer of gel electrolyte 5. Furthermore, the gel electrolyte layer 5 is covered with an encapsulating layer 7 for prevention of solvent evaporation.

Figure 1C:
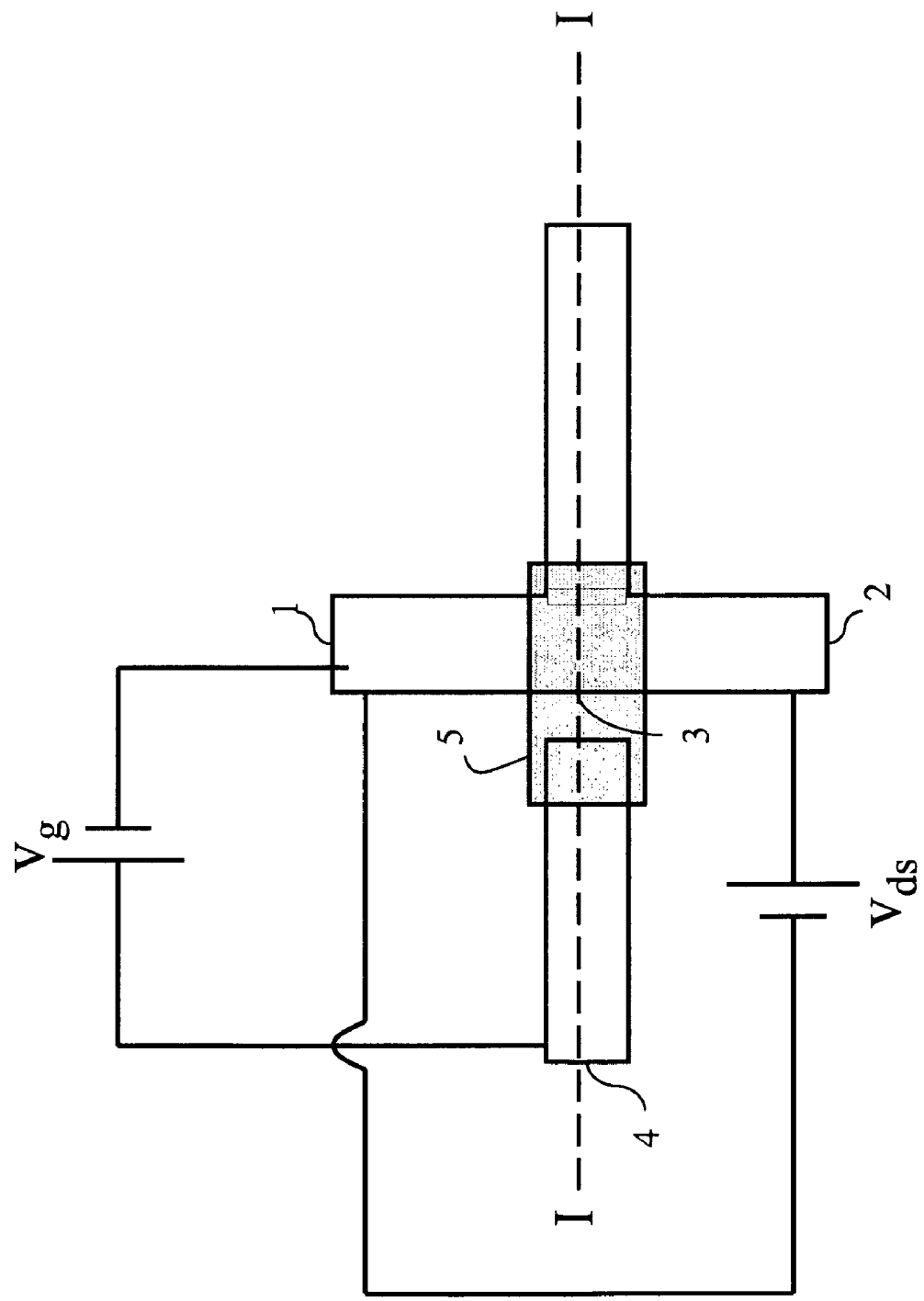

Working principle for the polarity of Vg shown in FIG. 1, and in the case of an organic material which is conducting in its oxidized state and non-conducting when reduced to its neutral state: when a gate voltage Vg is applied between the gate electrode 4 and the electrochemically active element 3, the gate electrode is polarized positive (anode), and the electrochemically active element is polarized negative (cathode). This leads to onset of electrochemistry in the electrochemically active element and at the gate electrode; the organic material in the transistor channel is reduced at the same time as an oxidation reaction takes place at the gate electrode. The reduced material in the transistor channel displays a drastically diminished electrical conductivity, which results in the closure of the transistor channel and an effective reduction of the current between source and drain for a given source-drain voltage Vds, i.e. the transistor is in an "off" mode. When the external circuit supplying voltage to the gate electrode and the electrochemically active element is broken, the oxidation state of the transistor channel is maintained. No reversal of the electrochemical reactions is possible because of the interruption by electrolyte 5 of electron flow between gate electrode 4 and electrochemically active element 3. Thus, the bi-stable transistor has a memory-function: It is possible to switch on or off the transistor channel with short pulses of gate voltage, Vg, applied to the gate. The respective conductivity states remain when gate voltage is removed (a zero-power device). Further adjustments of conduction characteristics in the electrochemically active element, or resetting thereof to the initial, high conductivity mode, can be performed by applying different voltages to the gate electrode.

As explained above in the summary, the transistor device of the invention may easily be made to function as a diode. This is achieved for example through a transistor device architecture as shown schematically in FIG. 1C. In comparison to the device discussed above in relation to FIG. 1A, the gate voltage is instead applied between the gate electrode 4 and the source contact 1. There is no difference in potential between the positions for the negative polarity of the Vg voltage, but the change of this position makes it possible to short-circuit the gate electrode and source contact through replacing Vg with a conductor. Such a short-circuit results in that, when a positive voltage is applied to the source contact 1, the gate electrode 4 will be polarized positively also. Accordingly, and as described above, resistance will mount within the transistor channel upon reduction or oxidation in the electrochemically active element 3, which resistance will hinder charge transport there through. As the resistance in the channel mounts, the current supplied to the "common" source and gate will increasingly be led to the gate electrode, further feeding the electrochemical reaction and thus raising the resistance in the transistor channel even more. If the polarity of the source-drain voltage is reversed, the opposite situation will arise, so that the electrochemically active element is instead rendered conducting. Thus, the device, when the source and gate are connected in this way, will allow current in one direction and not in the other, and in practice functions as a diode. The diode is operative as long as there is a voltage applied between the "common" source electrode 1 and the separate gate electrode 4. However, short-circuiting the common electrode 1 and the gate electrode 4 will in principle give the same result as an applied voltage. In other words, a diode functionality is provided even if the gate voltage Vg is set at 0 V.

Figure 2A:
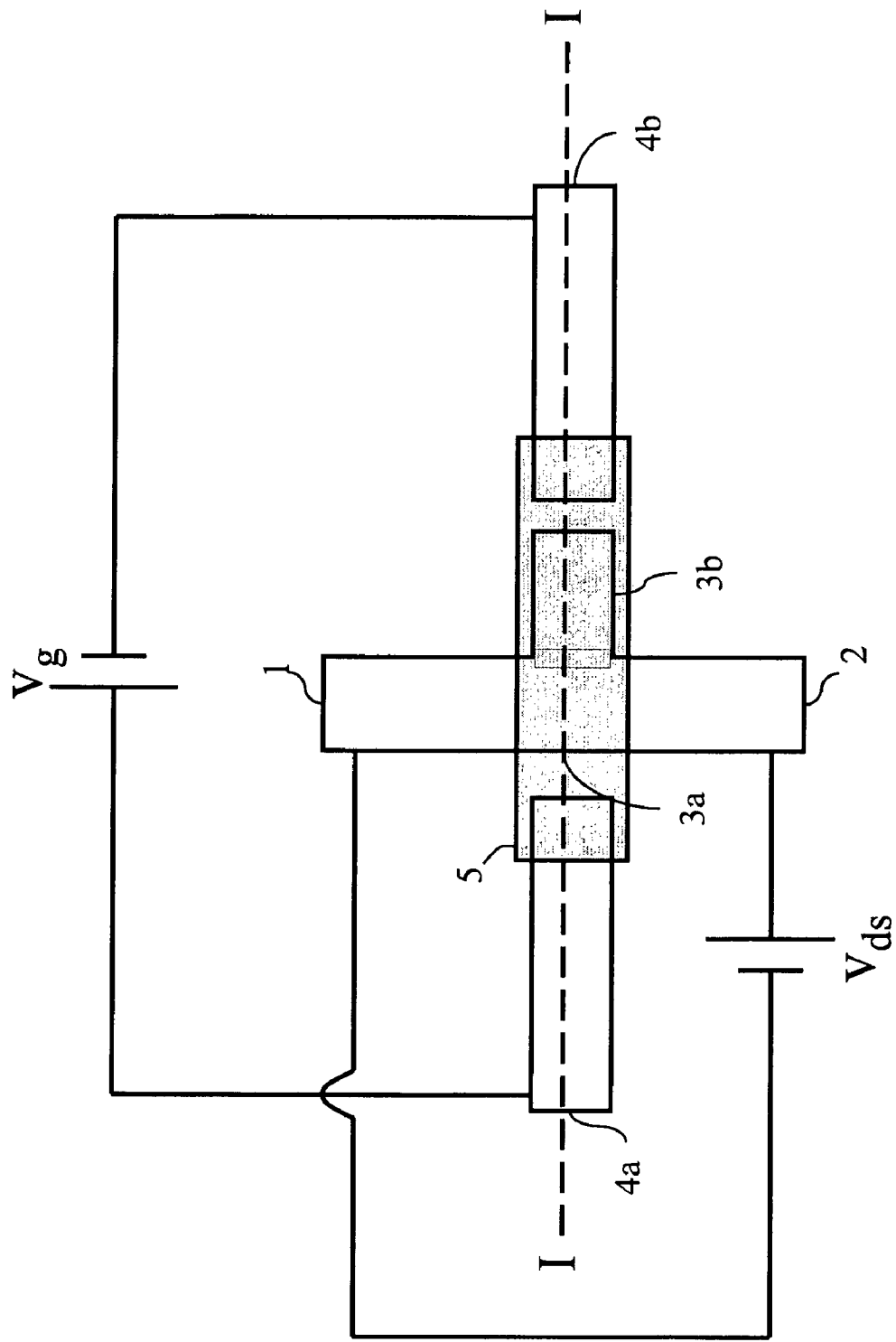
FIG. 2. Schematic structure of a dynamic transistor according to one embodiment, showing (A) a top view and (B) a cross-section along I-I in A.
Figure 2B:
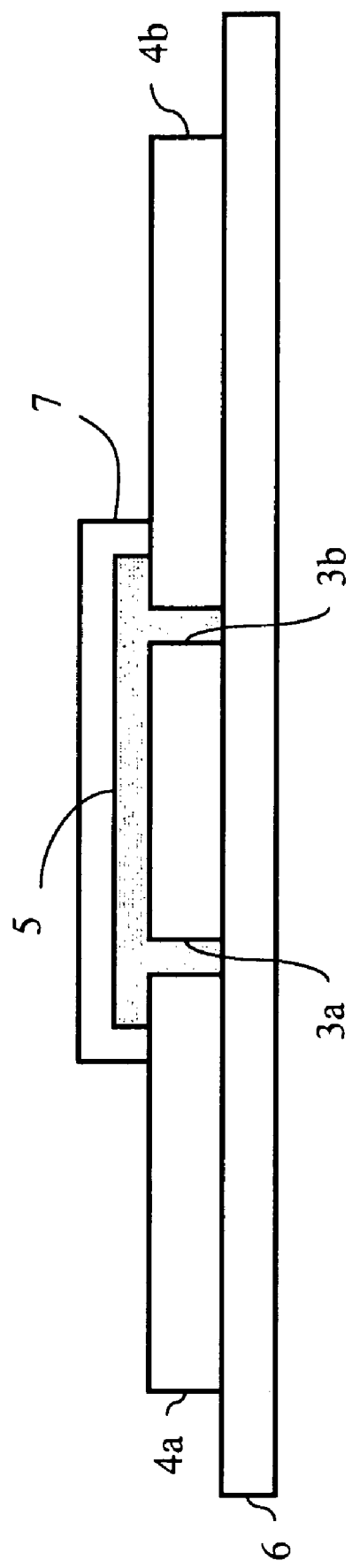

Dynamic transistor: FIGS. 2A and 2B schematically show a dynamic transistor. The transistor comprises a source contact 1, a drain contact 2 and an electrochemically active element 3, which have all been formed from a continuous piece of organic material. The electrochemically active element 3 comprises a transistor channel 3a and a redox sink volume 3b. Both the source and drain contacts are in electrical contact with an external power source, which allows the application of a voltage Vds between them. The transistor further comprises two gate electrodes 4a and 4b arranged on either side of the electrochemically active element 3. The gate electrodes can be formed from the same organic material as the source and drain contacts and the electrochemically active element. The gate electrodes are in electrical contact with an external power source, which allows application of a voltage Vg between them. All of these organic material components have been deposited in one layer on a support 6. On top of this layer, covering parts of the gate electrodes 4a and 4b and the active element 3, is a layer of gel electrolyte 5. Furthermore, the gel electrolyte layer 5 is covered with an encapsulating layer 7 for prevention of solvent evaporation. Working principle for the polarity of Vg shown in FIG. 2, and in the case of an organic material which is conducting in its oxidized state and non-conducting when reduced to its neutral state: when a gate voltage Vg is applied between the gate electrodes 4a and 4b, gate electrode 4a is polarized positive (anode), and gate electrode 4b is polarized negative (cathode). This leads to onset of electrochemistry in the electrochemically active element; the organic material in the transistor channel 3a (adjacent to gate electrode 4a) is reduced, while the organic material in the redox sink volume 3b (adjacent to gate electrode 4b) is oxidized. These electrochemical reactions require an internal transfer of electrons within the electrochemically active element. Electrons that are released in the oxidation reaction in the redox sink volume migrate to the transistor channel, where they replenish the electrons consumed in the reduction of organic material occurring in this segment of the electrochemically active element. The reduced volume in the transistor channel displays a drastically diminished electrical conductivity, which results in the closure of the transistor channel and an effective reduction of the source-drain current for a given source drain voltage Vds, i.e. the transistor is "off". When the external circuit applying voltage to the gate electrodes 4a and 4b is broken, a spontaneous discharge occurs, in that electrons flow from the reduced material in the transistor channel to the oxidized material in the redox sink volume, until the original redox state is re-established within the electrochemically active element. For maintenance of overall charge neutrality, this flow of electrons within the electrochemically active element is accompanied by an ion flow within the solidified electrolyte.

Figure 3A:
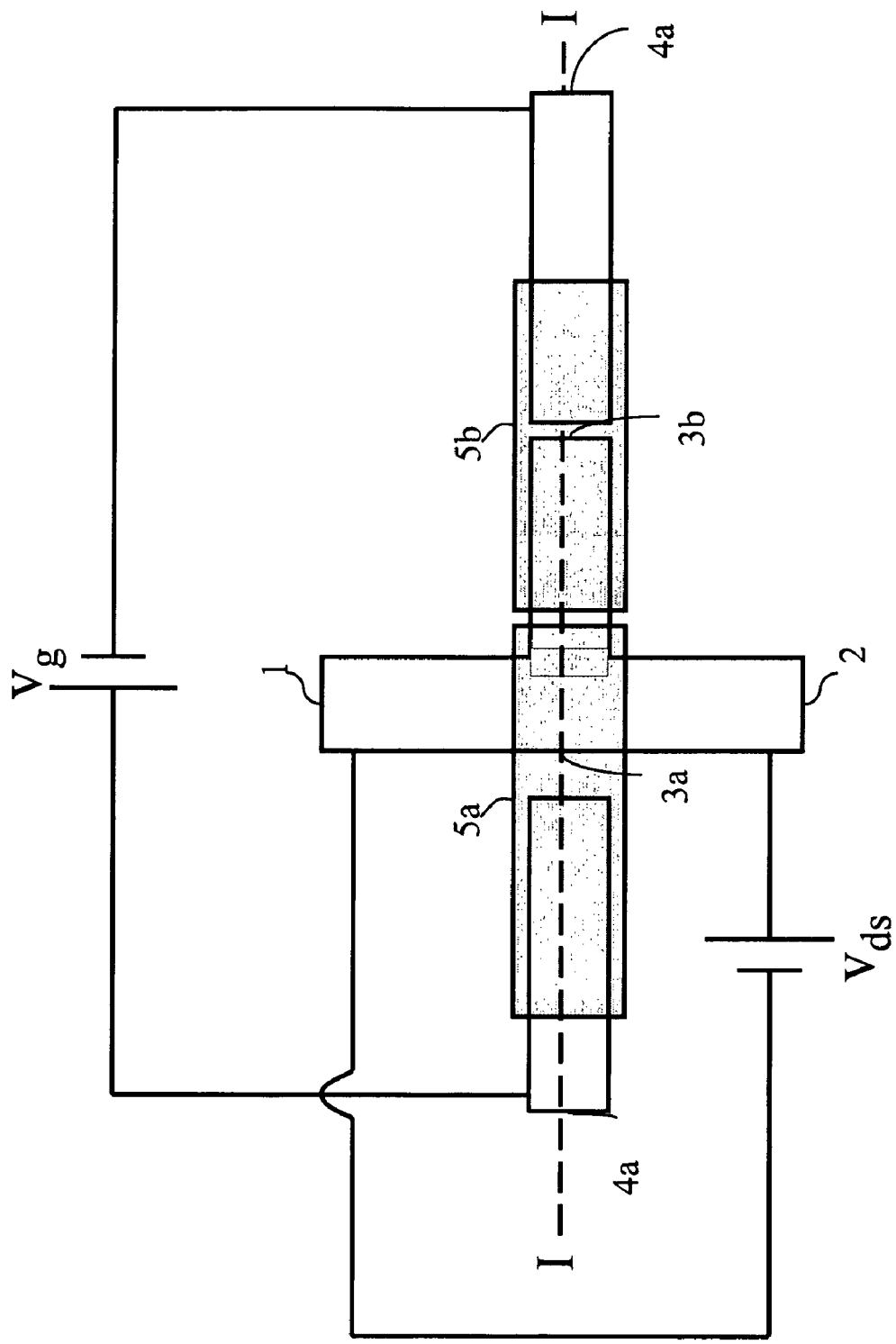
FIG. 3. Schematic structure of another embodiment of a bi-stable transistor according to one embodiment, showing (A) a top view and (B) a cross-section along I-I in A.
Figure 3B:
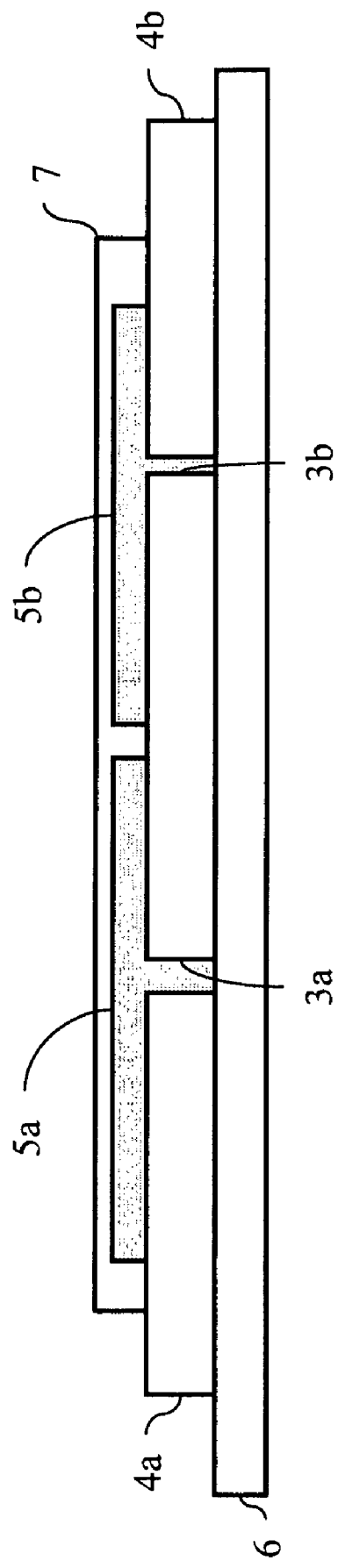

Bi-stable transistor (type 2): FIGS. 3A and 3B schematically show another embodiment of a bi-stable transistor, the architecture of which is based on the dynamic transistor architecture described immediately above. With reference to FIGS. 3A and 3B, this embodiment of a bi-stable transistor has the same components as said dynamic transistor, the difference being that the layer of solidified electrolyte 5 is patterned, forming two separate segments of electrolyte 5a and 5b. This patterning has the effect of interrupting ion flow within the electrolyte, which interruption in turn means that no spontaneous reversal of electrochemical reactions can occur between transistor channel 3a and redox sink volume 3b. In similarity to the case of the first bi-stable transistor device described above, the oxidation state of the transistor channel is maintained when the external circuit, here supplying voltage to the gate electrodes, is broken.

Experiment 1 (on bi-stable and dynamic transistors)—Materials and methods Bi-stable (type 1) and dynamic transistors were realized by patterning films of partially oxidized poly (3,4-ethylenedioxythiophene) with poly(styrene sulphonate) as counterions (frequently referred to as PEDOT:PSS in the present text) into a T-shaped structure. The design followed the schematic drawings of the bi-stable and dynamic transistors presented in FIGS. 1 and 2, respectively. In its pristine, partially oxidized state, PEDOT:PSS films as provided in the form of Orgacon™ EL350 from AGFA are conductive, providing the opportunity of modulating the current in the transistor channel by reduction of the PEDOT:PSS electrochemically. All processing and material handling was done in ambient atmosphere.

Patterning through screen-printing: PEDOT:PSS was applied as a thin film on a polyester carrier, Orgacon™ EL-300Ω/square, as provided by AGFA. Conducting patterns were generated using a screen-printed deactivation paste: Orgacon-Strupas gel, as provided by AGFA, was mixed with an aqueous sodium hypochlorite solution, resulting in a concentration of the active degradation agent of approximately 1.2%. Printing was performed using a manual screen printing board (Movivis, purchased from Schneidler) using a screen with 77 lines/cm mesh. After 1 minute, the deactivation agent was removed from the PEDOT:PSS film by washing thoroughly with copious amounts of water.

Deposition of source and drain contacts and gate electrode(s): After patterning of the PEDOT:PSS film, silver paste (DU PONT 5000 Conductor) was printed on top of the PEDOT:PSS areas that form the drain and source contacts and gate electrode(s) in order to improve the electrical contact of the respective element. Alternatively, the transistors can be entirely made of organic materials by locally increasing the layer thickness of the PEDOT:PSS in the gate, source and drain areas by drying-in of a PEDOT-PSS solution (Baytron P™ from Bayer) onto these areas. Such all-organic transistors were successfully realized on polyester foils.

Deposition of gelled electrolyte: Calcium chloride (2%), iso-propanol (35%), and gelatin (10%) (Extraco gelatine powder 719-30) were dissolved in de-ionized water at approximately 50° C. (weight percentages of the resulting gel in parenthesis). Structures of gelled electrolyte on patterned PEDOT:PSS film were formed by printing the gel on top of the PEDOT:PSS film. The thickness of the gelled electrolyte ranged from 20 to 100 µm. Gelled electrolyte structures were realized at line widths down to 300 µm. Screen-printing of gelled electrolyte was performed using a 32 mesh screen. The distance between the drain and source contacts was typically 1 to 2 mm.

Encapsulation: The gelled electrolyte was coated with a waterproof coating, such as plastic paint or foils, encapsulating the device. Shelf lifetimes of several months were achieved.

Electrical characterization: All testing was performed in ambient atmosphere at room temperature. Current-voltage (I-V) transistor curves were measured with a HP Parameter Analyzer 4155 B, in combination with an external HP E3631A power supply.

Experiment 1—Results

Bi-stable transistor: A bi-stable transistor such as that shown schematically in FIGS. 1A and 1B was realized. The bi-stable transistor had a transistor channel width of 600 µm and a gel width of 800 µm, with a transistor channel of 0.48 cm2. However, smaller dimensions were also successfully tested using photolithographic photoresist patterning in combination with reactive ion plasma etching. These devices exhibited channel widths ranging from 5 to 20 µm and a gel width of 20 µm.

Typically, the gate voltages Vg applied to the gate electrode were in the interval between 0 V and 0.7 V. Drain-source characteristics were determined by sweeping the source-drain voltage from 0 V to 2 V. The resulting I-V curves are displayed in FIG. 4.

Characteristic switching times for the conductivity modulation were determined by applying a square shaped modulation voltage (alternating between 0 V and 1 V) and measuring the resulting current changes. Typical rise and decline times (defined as the time required for a 90% increase respectively decrease of the current level) were determined as 0.1 s and 0.2 s, respectively.

On/Off ratios (defined as the current ratio Ids,max/Ids,min at a source-drain voltage Vds of 2 V for Vg=0 V (on) and Vg=0.7 V (off)) reached 15000.

Figure 4:
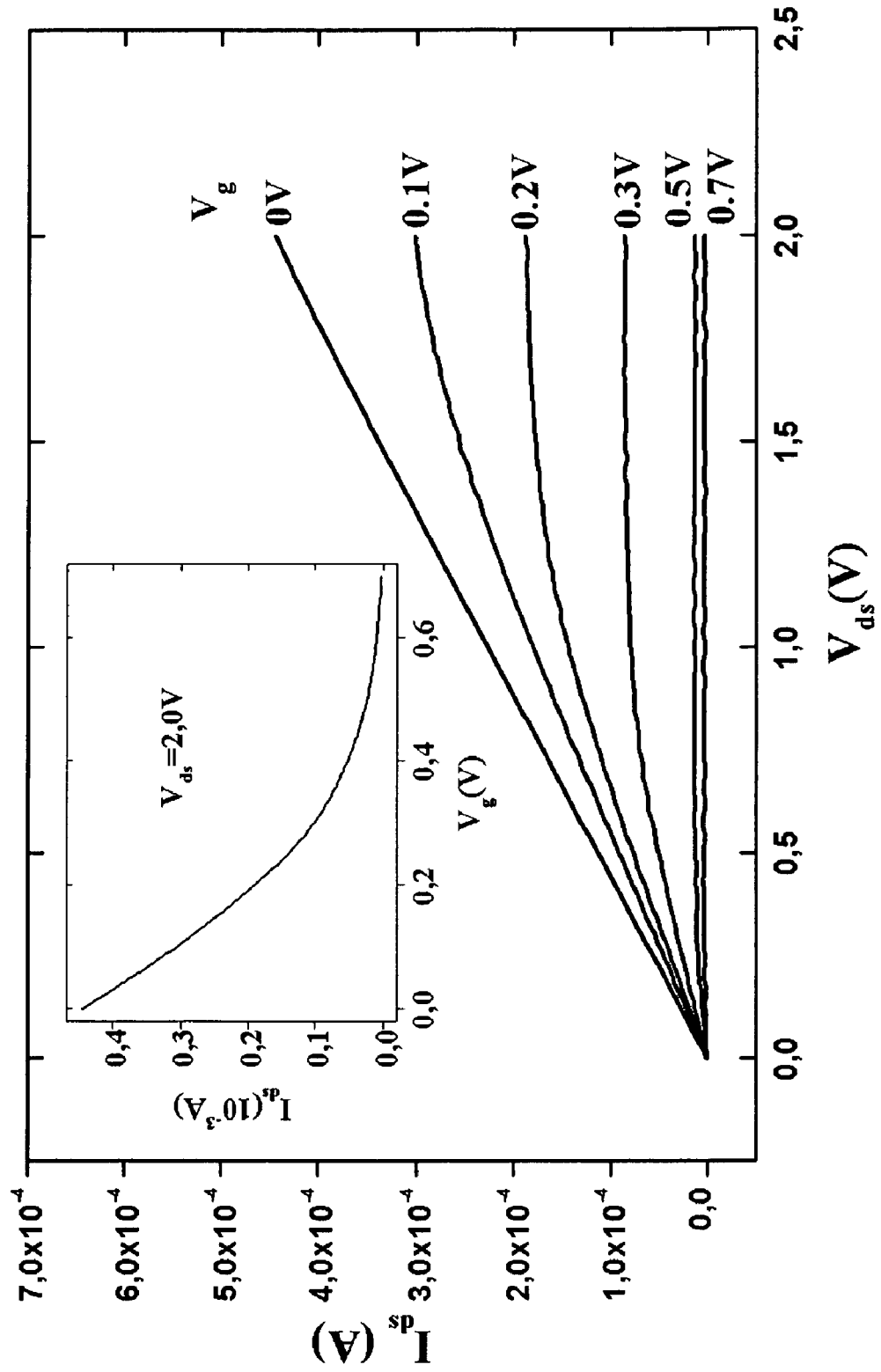
FIG. 4. Ids vs Vds characteristics at various gate voltages for experiments carried out on a bi-stable PEDOT:PSS transistor as shown in FIG. 1. The inset shows Id vs Vg at constant Vds (Vds=2.0 V).

FIG. 4 displays the output characteristics of the bi-stable transistor, Ids vs Vds for different gate voltages.

The inset in FIG. 4 shows the source-drain current Ids as a function of the gate voltage Vg for a constant source-drain voltage Vds (Vds=2 V). From these curves, an important parameter, the trans-conductance gm, can be evaluated. gm is defined as:

$$g_m = \frac{\delta I_{ds}}{\delta V_g}(V_{ds} = \text{constant})$$

The value of the trans-conductance of the bi-stable transistor device was found to be −1.2 mA/V.

Figure 5:
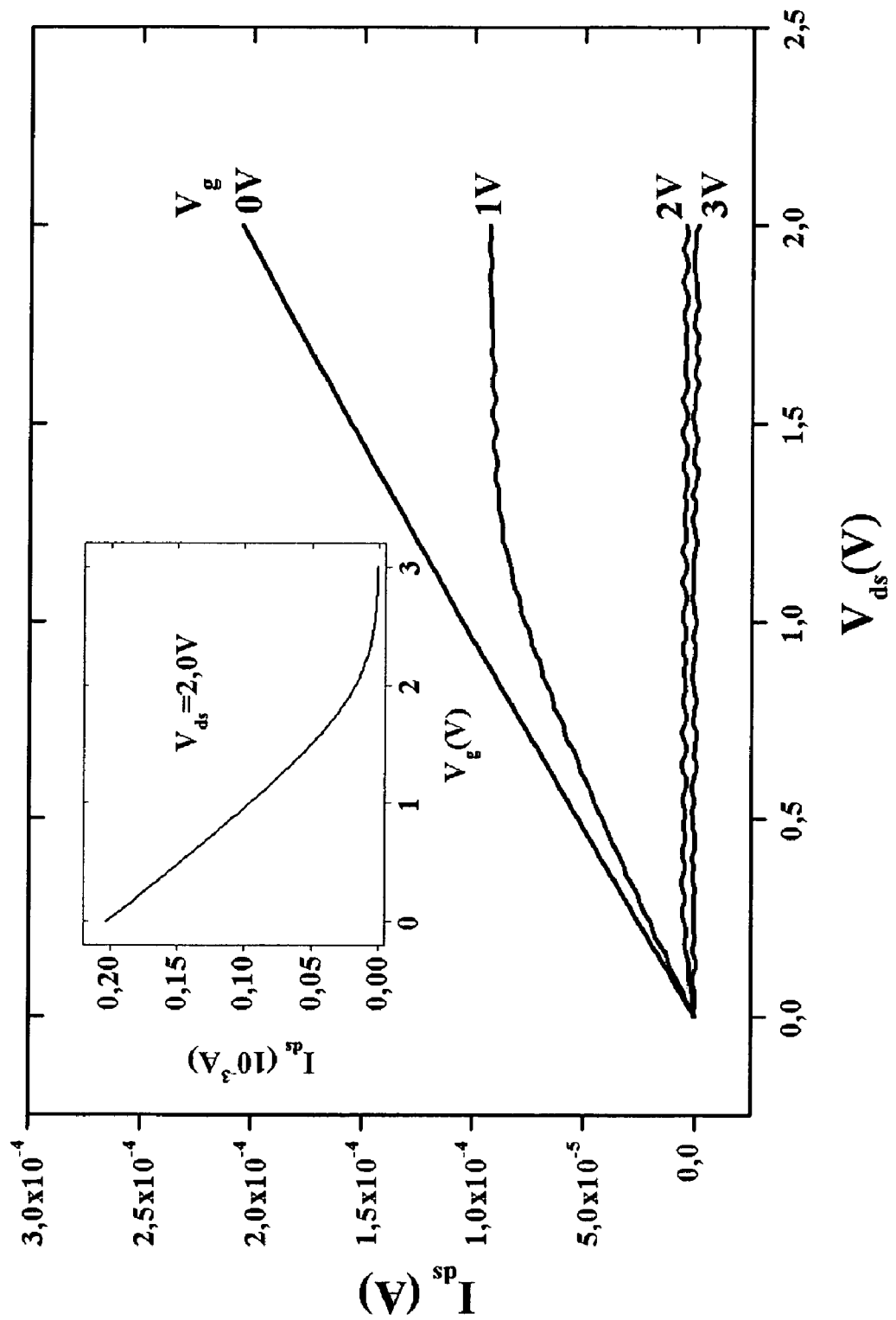
FIG. 5. Ids vs Vds characteristics at various gate voltages for experiments carried out on a dynamic transistor. The inset shows Id vs Vg at constant Vds (Vds=2.0 V).

Dynamic transistor: A dynamic transistor such as that shown schematically in FIGS. 2A and 2B was realized. The dynamic transistor had a channel width of 250 µm and a gel width of 900 µm, with a transistor channel of 0.23 cm2. However, smaller dimensions of PEDOT and gel patterns down to 4 µm were successfully reached using photolithographic patterning. These devices exhibited channel widths ranging from 4 to 20 µm and a gel width of 20 µm. Typically, the gate voltages Vg applied to the gate electrodes spanned an interval of 0 V to 3 V. On/Off ratios (defined as the current ratio Ids,max/Ids,min at a source-drain voltage Vds of 2 V for Vg=0 V (on) and Vg=3 V (off)) reached 1000. FIG. 5 displays the output characteristics of the dynamic transistor, Ids vs Vds for different gate voltages.

The inset in FIG. 5 shows the source-drain current Ids as a function of the gate voltage Vg for a constant source-drain voltage Vds (Vds=2 V). From these curves, the value of the trans-conductance of the dynamic transistor device was found to be −0.10 mA/V.

Experiment 2 (on Bi-Stable Transistors)—Materials and Methods

Bi-stable (type 1) transistors were realized by patterning films of polyaniline. The design followed the schematic drawing of the bi-stable transistor presented in FIGS. 1A and 1B.

Patterning through evaporation and doctor blade: Panipol™ F (commercial polyaniline) was provided in solution in toluene or in m-cresol, at a concentration of 10 mg/ml in both cases. One transistor was made starting from each of the two solutions of polyaniline. The solvent was evaporated, and the polyaniline formed a thin film on a plastic carrier (conventional transparency films). Conducting patterns were made using a doctor blade. Deposition of source and drain contacts and gate electrode: After patterning of the polyaniline film, silver paste (DU PONT 5000 Conductor) was printed on top of those polyaniline areas that formed the drain and source contacts. To ensure good contact with the power source, a silver paste (DU PONT 5000 Conductor) was printed on to the areas not covered with electrolyte on the gate electrode. Alternatively, the transistors can be entirely made of organic materials by locally increasing the thickness of the layer of polyaniline in the gate, source and drain areas, by drying-in of a polyaniline solution (e g Panipol™) onto these areas.

Deposition of gelled electrolyte: In the transistor employing polyaniline originally dissolved in toluene, gelatin (Extraco gelatin powder 719-30) was dissolved in de-ionized water at approximately 50° C., in an amount resulting in a gel having 10% by weight of gelatin, which was used as electrolyte. In the transistor employing polyaniline originally dissolved in m-cresol, Blågel™ (purchased from Apoteksbolaget, Sweden) was used as gelled electrolyte. Structures of gelled electrolyte on the respective patterned polyaniline films were formed by painting the gel on top of the polyaniline films with a brush. The thickness of the gelled electrolyte ranged from 100 to 300 μm. The distance between the drain and source contacts was typically from 1 to 2 cm.

Electrical characterization: All testing was performed in ambient atmosphere at room temperature. Current-voltage (I-V) transistor curves were measured with a HP Parameter Analyzer 4155 B in combination with an external HP E3631A power supply.

Experiment 2—Results

Figure 6A:
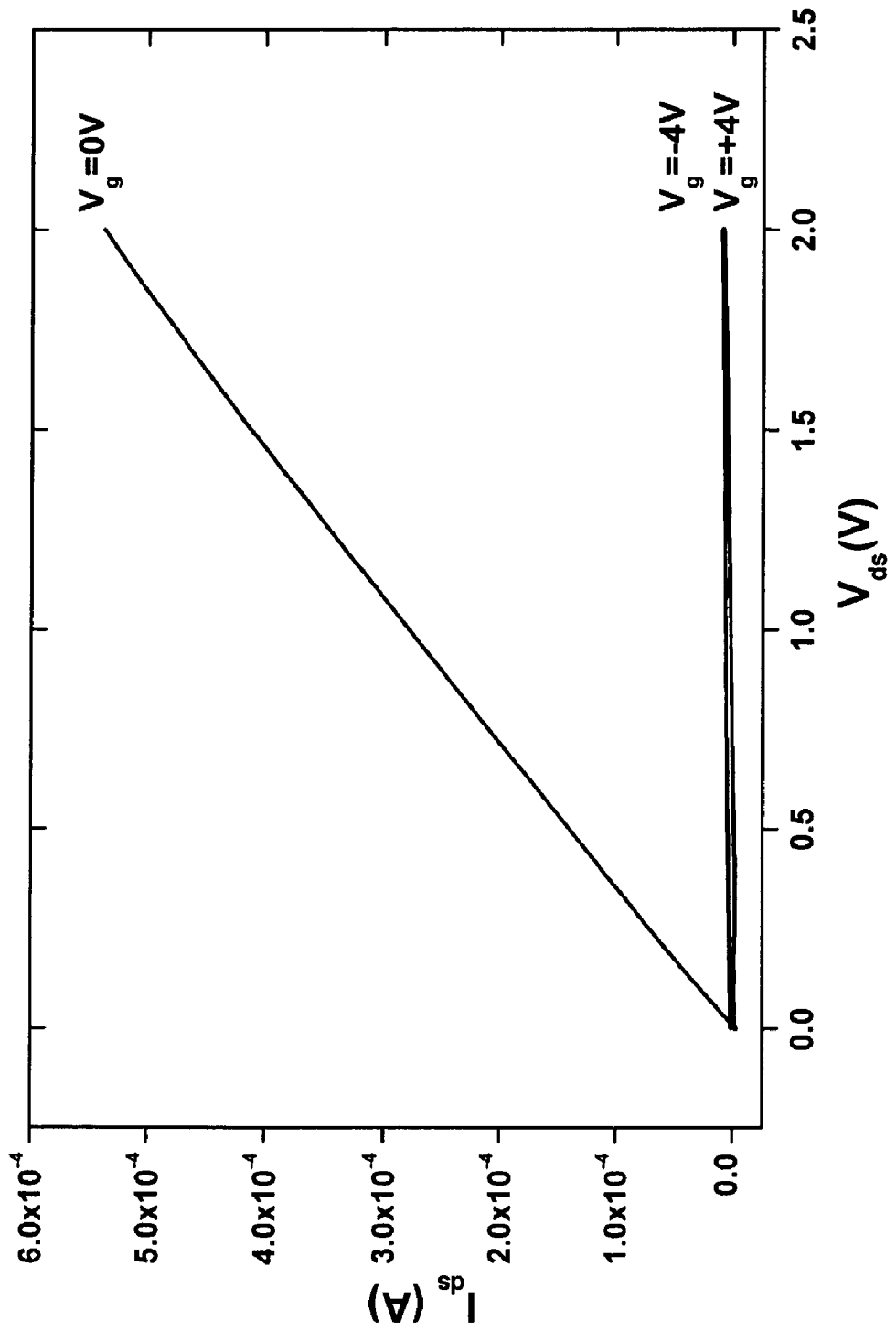
FIG. 6. Ids vs Vds characteristics at various gate voltages for experiments carried out on a bi-stable polyaniline transistor as shown in FIG. 1. The polyaniline was supplied in toluene solution. (A) General characteristics. (B) Y-axis expansion of a part of the diagram shown in A.
Figure 6B:
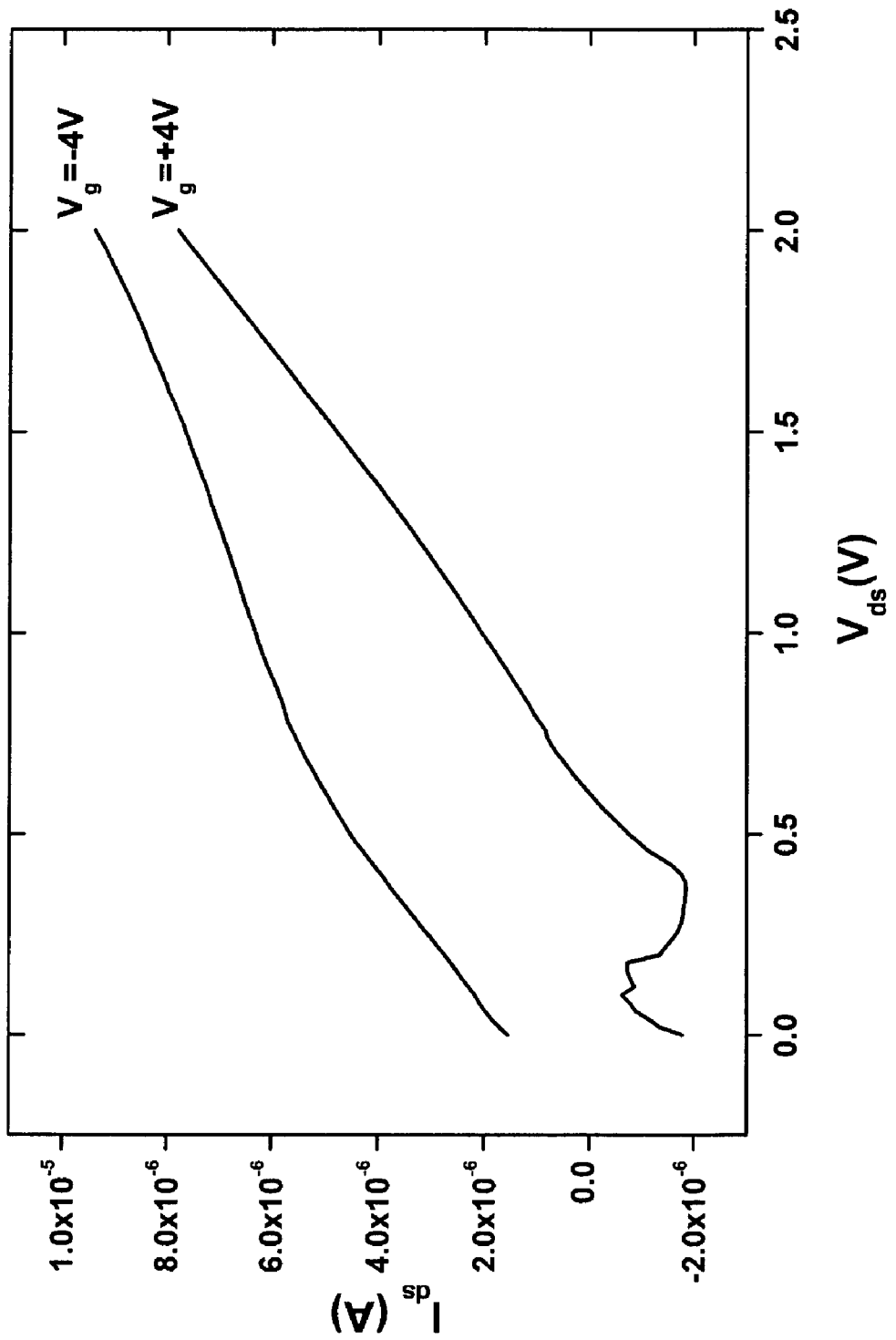
Figure 7:
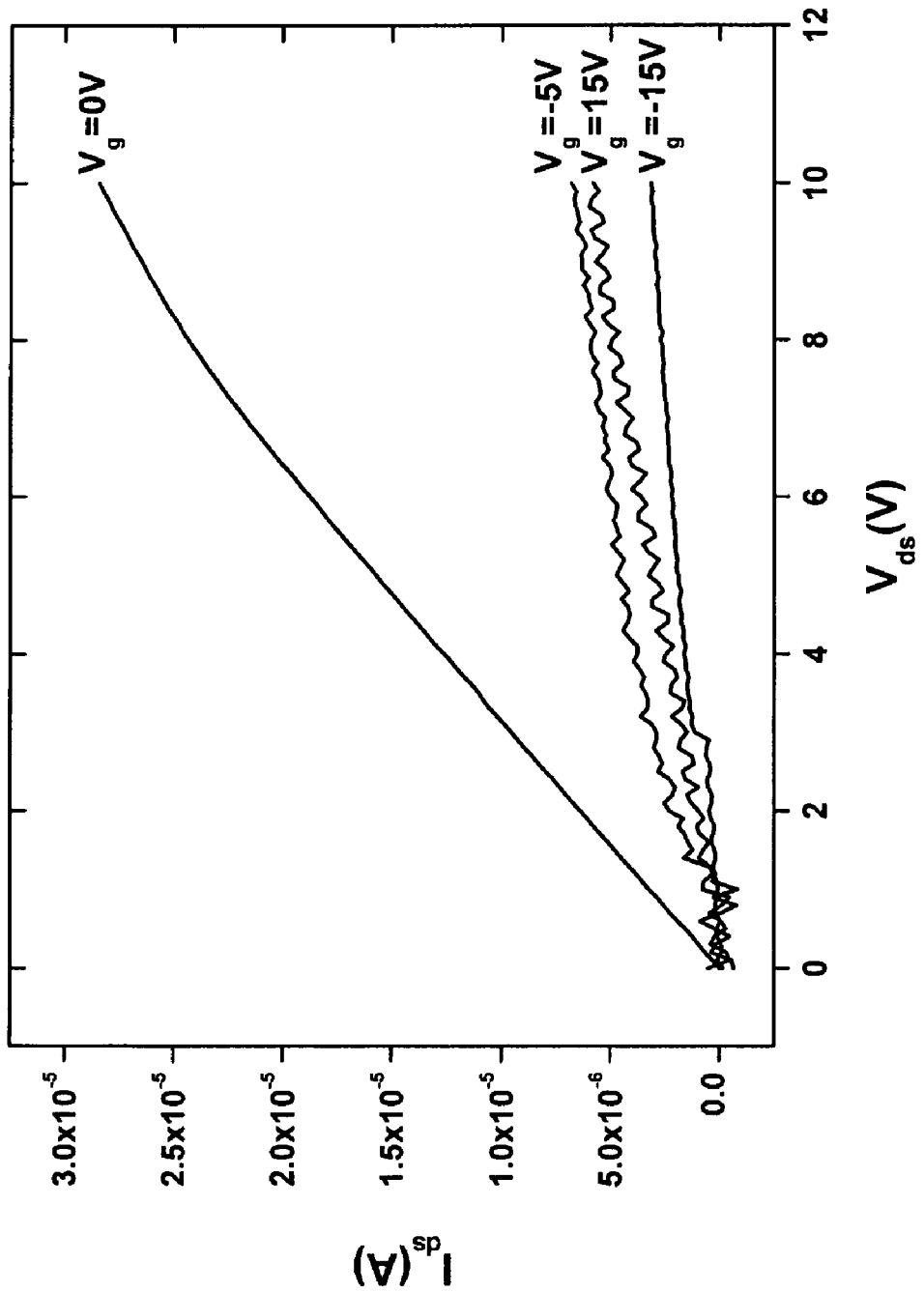
FIG. 7. Ids vs Vds characteristics at various gate voltages for experiments carried out on a bi-stable polyaniline transistor as shown in FIG. 1. The polyaniline was supplied in m-cresol solution.

Bi-stable transistors such as that shown schematically in FIGS. 1A and 1B were realized. The bi-stable transistors had a transistor channel width of 3 mm and a gel width of 4 mm, with a transistor channel of 12 mm 2. Typically, the gate voltages Vg applied to the gate electrode were in the interval between −15 V and 15 V. Drain-source characteristics were determined by sweeping the source-drain voltage from 0 V to 10 V. The resulting I-V curves are displayed in FIG. 6 (polyaniline supplied in toluene solution) and FIG. 7 (polyaniline supplied in m-cresol solution).

On/Off ratios (defined as the current ratio Ids,max/Ids,min at a source-drain voltage Vds of 2 V for Vg=0 V (on) and Vg=4 V or −4 V (off)) reached 100 for both negative and positive gate voltages.

Three-Terminal Transistors

Due to the impracticality to design circuits based on transistors with floating gate supplies a three-terminal transistor having a fixed gate supply will be described in the following. In this mode there is only one gate electrode and its potential is always referenced to the drain or source electrode. Thus, unlike the four-terminal devices described above and having 2 gate electrodes, three-terminal devices have only one gate electrode and the gate potential is thus fixed in relation to the source/drain potentials. In comparison, the controlling gate potential in four-terminal devices is applied over the two gate electrodes and thus floats with respect to drain and source. 3-terminal electrochemical transistors have been investigated from a functional point-of-view. As it turns out, "normally open" transistors (i.e. transistors that close the transistor channel upon application of a voltage to the gate electrode) have characteristics that are similar to p-channel depletion-mode mosfet devices. Many of the most promising organic materials for the present invention (e.g. PEDOT:PSS) result in such "normally open" transistors, and electrical design rules for proper operation of such "normally open" electrochemical transistors have therefore been established and are specified below.

Figure 9A:
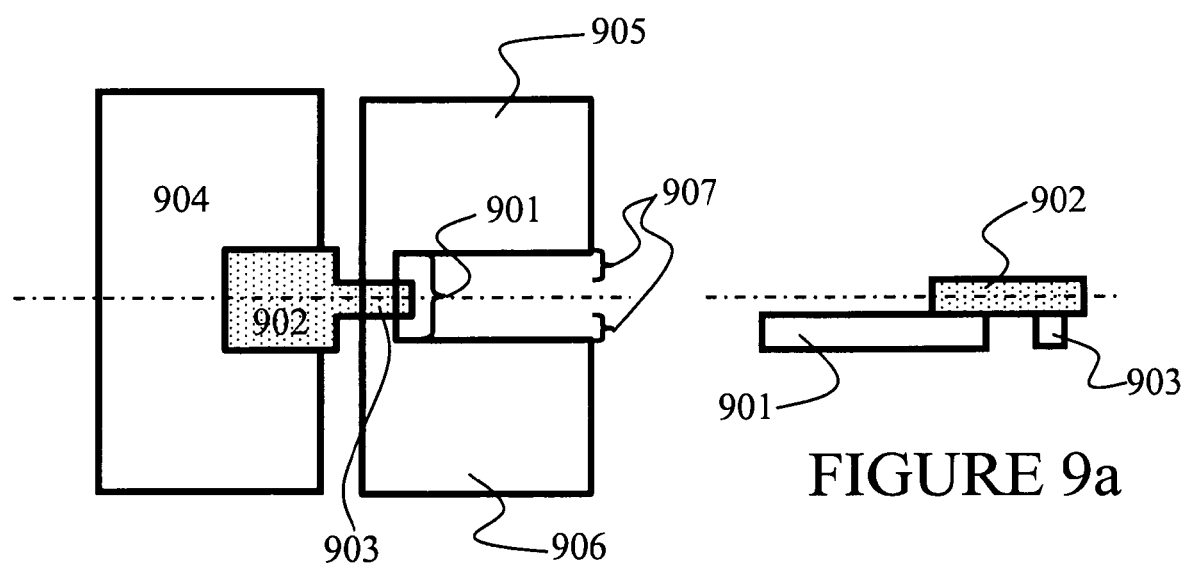
FIG. 9a: Illustrates a top view and a side view of a three-terminal transistor having a lateral structure.

An example of a three-terminal electrochemical transistor 900 is illustrated in FIG. 9a (top view on left and side view on right). The electrochemically active element 901 comprises a thin channel 907 of PEDOT:PSS on top of which electrolyte 902 is deposited. The electrolyte 902 thus defines a transistor channel 903. The area of the transistor channel may, for example, be 0.5*0.5 mm 2, and the thickness may be 0.2 μm (for example using Orgacon™ EL350 foil from AGFA). The electrolyte 902 is extended over the gate electrode 904 so that it covers a much larger area than on the transistor channel side to avoid over-oxidizing the gate electrode. The larger areas of the three terminals (i.e. the gate electrode 904, the source contact 905, and the drain contact 906) are used as "pad areas" to allow easy connection to the device.

The thin parts 907 of the electrochemically active element that extend outside the transistor channel are kept to a minimum in order to minimize the on-resistance of the transistor. However, the existence of such parts 907 is advantageous for two reasons. First, they allow some mis-alignment of the electrolyte. The second reason is that the transistor channel reduction has a tendency to migrate somewhat outside the electrolyte-covered area. In order to limit the buildup of permanently reduced areas, this spreading process should be as confined as possible. To this end, each of the two extended portions 907 may have about the same size as the electrolyte-covered part of the transistor channel. Using PEDOT:PSS as organic material, and the dimensions given above, each of these extended portions show a resistance of about 1 kohm.

Figure 8:
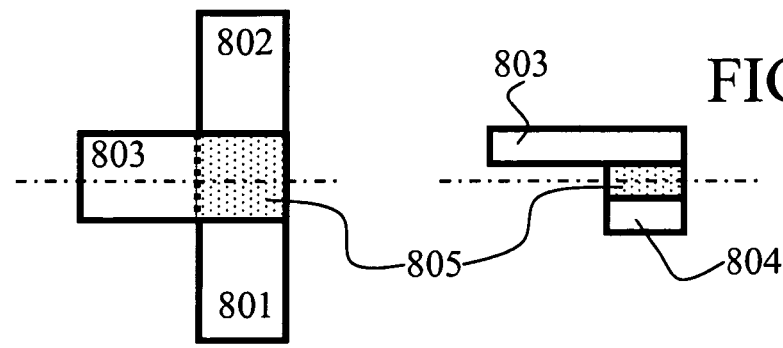
FIG. 8: Illustrates a top view and a side view of a three-terminal transistor having a vertical structure.
Figure 9B:
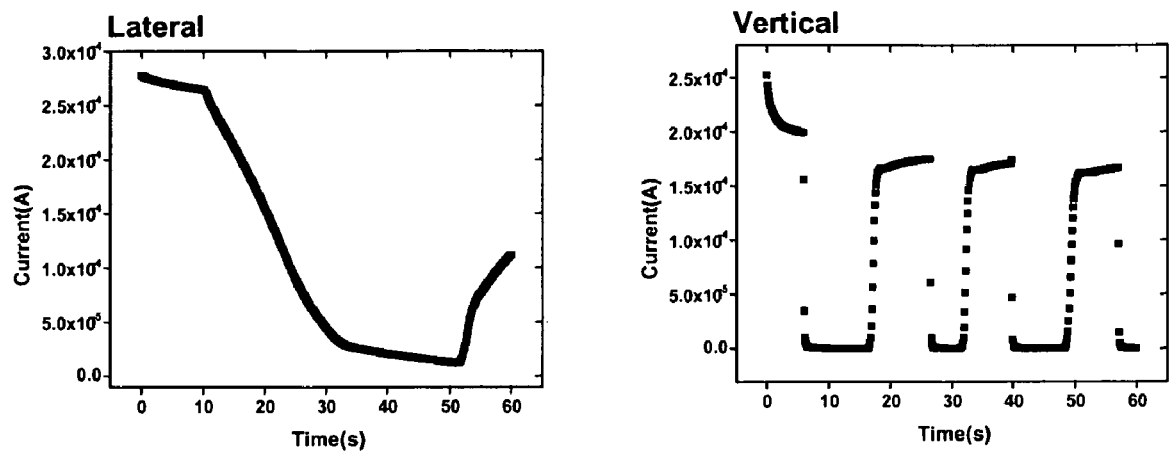
FIG. 9b: Graphs showing the response time for a transistor having a lateral structure (left) and vertical structure (right).
Figure 10:
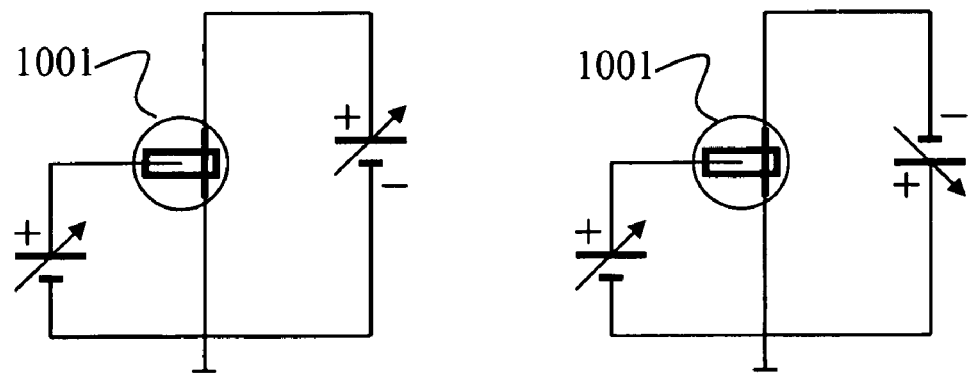
FIG. 10: Electrochemical transistor with gate voltage referenced to the positive terminal (right) and the negative terminal (left), respectively.

The structure illustrated in FIG. 9a is an example of a lateral transistor. As stated above, it is alternatively possible to use a vertical design, rendering vertical transistors having the gate electrode positioned on-top of the channel. The fundamental differences between vertical and lateral devices are illustrated in FIG. 8 (top view on left and side view on right). In the vertical configuration the gate electrode 803 is sandwiched on the transistor channel 804, having the electrolyte 805 as an intermediate carrier, and the source and drain electrodes 801, 802 are typically arranged in the same plane as the transistor channel 840. Obviously, vertical as well as lateral configurations may be employed for any type of transistor that is in accordance with the present invention, and not only for the three-terminal transistor. In general, vertical transistors enable faster injection of ions into the transistor channel. However, apart from an increased speed, the two structures show similar electrical performance. FIG. 9b compares the performance of vertical and lateral transistors. The transistors are set-up as shown in FIG. 10 and described below as the third quadrant test. The drain-source current is measured for an input signal which toggles between 0 and 1 volts. Up to two orders of magnitude faster switching speed has been noticed in vertical transistors compared to lateral transistors. In real circuits such as the logical gates described above, this translates into less than a second switching time as compared to about 10 seconds for the lateral-based circuits. The temporal response of the transistor may be improved if a vertical configuration is employed. However, vertical structures generally require an additional layer of conducting material. On the other hand, when implementing more complex circuits consisting of many gates the manufacturing process must anyway allow for at least a second layer of connecting wires. This will most often open up the possibility to produce vertical transistors without additional manufacturing steps.

Experiment 3 (on Three-Terminal Transistors)—Materials and Methods

PEDOT:PSS was used as electrochemically active organic material. The PEDOT:PSS was coated on a polyester carrier as supplied by AGFA under the trade name Orgacon™ EL350. As electrolytes, two different mixtures were used. One was a mixture of hydroxyethyl-cellulose, sodium citrate, glycerol and DI-water, the other was a mixture of PSSNa, D-sorbitol, glycerol and DI-water.

The circuits presented were manufactured with a standard large area plotter (FC 2200, supplied by GraphTech Corporation). Patterns were created in the PEDOT:PSS film by mounting a knife in the pen holder. By applying a force just strong enough to cut through the PEDOT:PSS layer, but not through the polyester foil, different patterns were created. In order to define the area for the electrolyte, openings were created in a lamination foil which was laminated onto the PEDOT:PSS film. The electrolyte was drop caste in the opening followed by a baking step, 60° C. for 10 minutes. The resulting devices were thus not dependent on any narrow lines or thin dielectrics. In combination with solubility in common solvents this approach thus enables large-scale manufacturing using common printing techniques.

All measurements were performed in ambient atmosphere. Measurements are performed with Keithley 2400 Sourcemeter and HP power supply E3621A controlled via Labview.

Results

Figure 11:
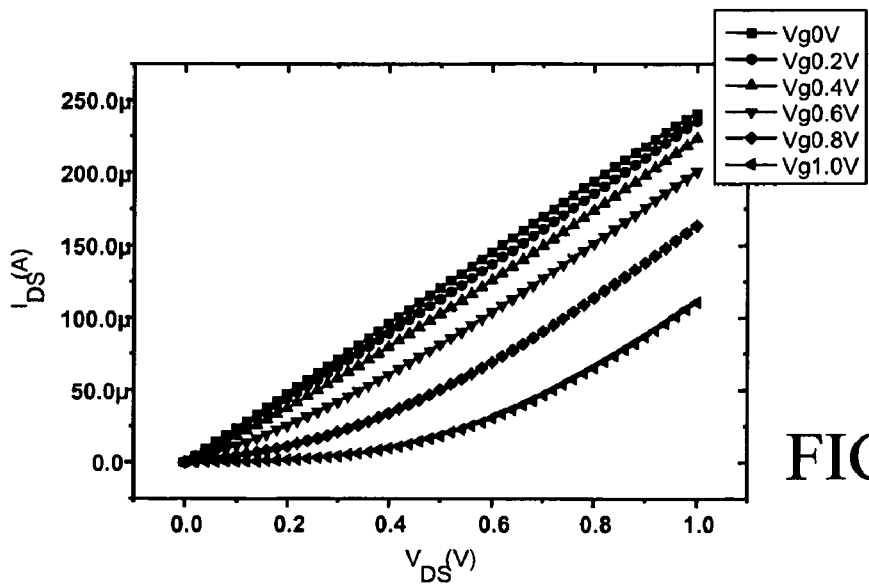
FIG. 11: Diagram illustrating the first quadrant characteristics of an electrochemical transistor.

In case the transistor typically is symmetric, there is no way to distinguish a priori between the source and drain. Rather, this will be a function of the applied voltages. Two test configurations will be distinguished in the following, depending on whether the gate voltage is referenced to the negative drain/source-supply or to the positive drain/source-supply. These configurations are referred to as first quadrant test circuit and third quadrant test circuit, respectively (left and right in FIG. 10, respectively). In FIG. 10 a transistor symbol 1001 that resembles a conventional transistor but still points out the particular structure of the electrochemical device is suggested. Measured characteristics in the first quadrant case (left in FIG. 10) is shown in FIG. 11. The graphs show the current through the transistor device as a function of the drain/source voltage parameterized by the applied gate voltage. The bottom graph thus relates to a gate voltage of 1.0 V, and the top graph relates to a gate voltage of 0.0 V. With 0.0 V at the gate, the transistor has a purely resistive behavior. Its on-resistance is seen to be about 4 kohm. If the gate voltage is decreased into negative values (not shown in the graph) the channel will oxidize further. However, since the PEDOT:PSS material is already oxidized to about 80% in its "natural state" (as supplied by AGFA) its resistance will only decrease very slightly. Also, there is a strong risk of the channel getting over-oxidized (rendering permanently non-conductive). Instead, increasing the gate voltage is more interesting as this starts to reduce the channel raising its resistance and thus lowering the current. The net effect is that the gate voltage modulates the drain/source current. By careful inspection it can be seen that the gate voltage has the strongest impact when it is larger than the drain/source voltage. As the drain/source voltage increases beyond the gate voltage the (differential) resistance will approach approximately the same level (4 kohm), independent of the applied gate voltage. Comparing to earlier known electronic devices, the I-V curves bear some similarities with those of triode vacuum tubes.

Figure 12:
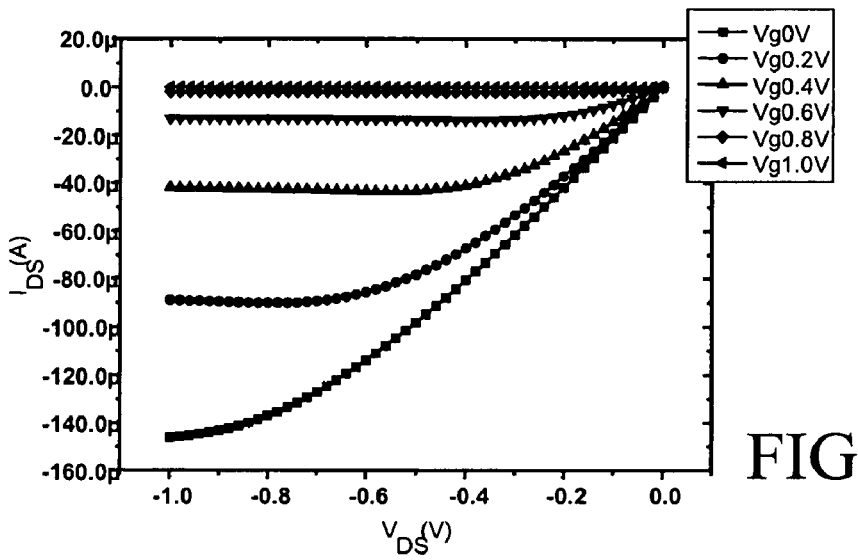
FIG. 12: Diagram illustrating the third quadrant characteristics of an electrochemical transistor.

The characteristics in the third quadrant show entirely different behavior as seen in FIG. 12. Rather than a resistive behavior the device enters into a constant-current mode as the voltage across it is increased. The gate voltage now controls the level of the current. Such behavior is well-known from traditional semiconductor and vacuum tube devices. In fact the similarity between our transistor and the pentode tube is quite strong. Both devices require the control potential to be outside the range of the voltage across the device. In the pentode case, the (grid) control voltage is negative while the applied (anode/cathode) voltage is positive. For our transistor the same is true but with reversed polarities. Also, for the pentode, too high positive grid voltage may destroy the device as this will lead to high grid currents. This is in analogy with the fact that negative voltages on the gate electrode may ruin the electrochemical transistor due to over-oxidation. Hence, it is realized that the three-terminal "normally open" electrochemical transistor has similarities with certain traditional electronic components.

Figure 13:
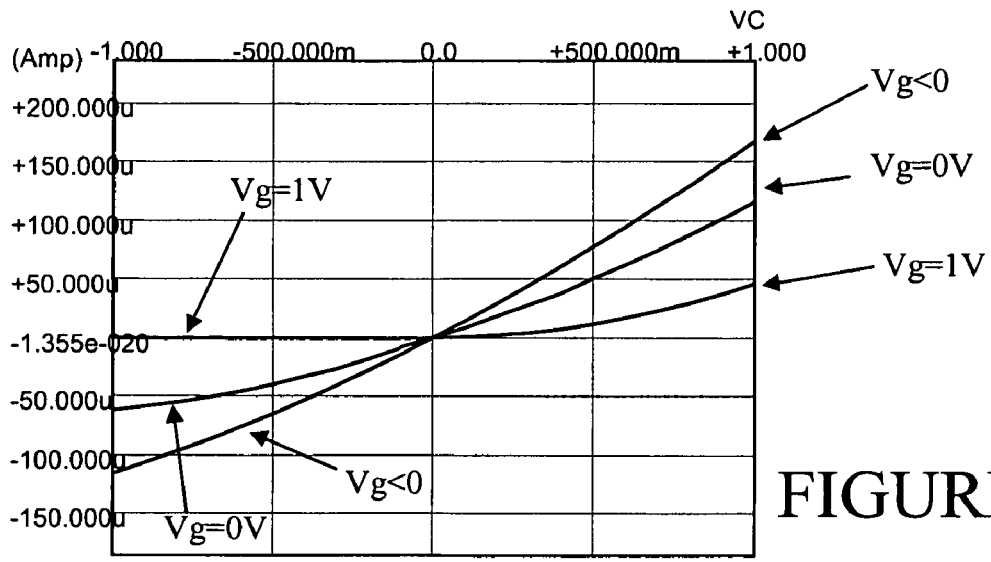
FIG. 13: Diagram from SPICE modeling the characteristics of a comparable p-mos depletion transistor.

Comparing with semiconductor devices, most of them are of the enhancement type where conduction is increased with increased control voltage. In fact, the behavior of the "normally open" electrochemical transistor is better recognized as a depletion mode transistor. In particular, a p-channel depletion mos-fet transistor can be used as a good model for our 3-terminal transistor. FIG. 13 shows the characteristics of such a transistor from a SPICE simulation (Simulation Program with Integrated Circuit Emphasis) where the geometry and doping parameters have been adjusted to give comparable voltage and current levels with our electrochemical transistor. A closer investigation of the two "modes" of operation shows that third-quadrant (pentode-style) mode is superior to first-quadrant mode. This can be seen by trying to fit "load-lines" to the characteristics shown in FIGS. 11 and 12 for a conceptual single-stage amplifier. It is hardly possible to achieve amplification at all in the first quadrant while this is easy to achieve in the third quadrant. Thus, all circuit designs to be described here utilize the transistor in the third-quadrant mode (corresponding to "normally open" mode). Furthermore, as was pointed out earlier, additional complexity is introduced in the circuitry design since the range of the input (gate) and output (source/drain) voltages do not overlap each other.

Given this background, using PEDOT:PSS in the form of Orgacon™ EL350 foil, we can now formulate three basic rules for the three-terminal transistor:

The source/drain terminal that is connected to the highest voltage defines the source.

Active behavior (switching, modulation) is obtained when gate voltage is higher than source voltage.

Gate voltage must never become lower than the drain voltage in order to avoid over-oxidation. Or, to be more specific: the gate voltage should never become more negative than the most negative potential in the channel of the transistor. Usually the most negative potential is defined by the drain voltage but it is possible, if the gate voltage changes rapidly, that part of the channel may over-oxidize due to dynamical effects. A more conservative rule that is always safe is thus to avoid that the gate voltage decreases below the source voltage.

However, alternative measures may be taken in order to reduce the occurrence of over-oxidation in the polymer. Such measures include, for example, the addition of additives to the electrolyte, and hence facilitate more liberal design rules.

Furthermore, we can use a suitably modified electronic model of the p-channel mos-feet device to mimic the behavior of our transistor. For our test transistor this amounted to selecting a silicon device with a channel length of 1 μm and width 3 μm. In the SPICE simulator, "Threshold" was set to 1 volt, "transconductance" was set to 10-4, and drain and source "ohmic resistance" was set to 1 kohm, respectively.

Figure 14:
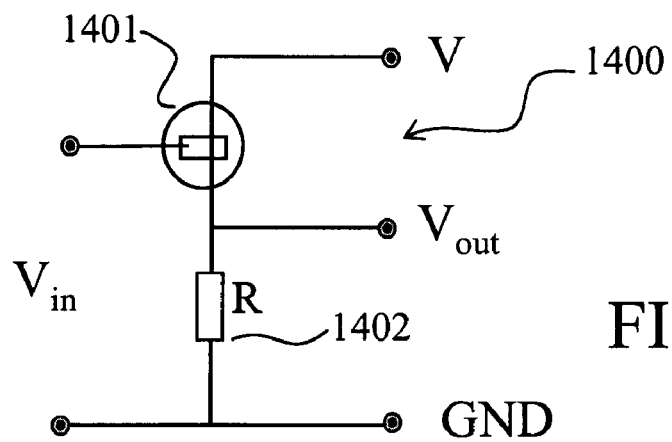
FIG. 14. Circuitry in the form of a single-stage amplifier/switch.
Figure 15:
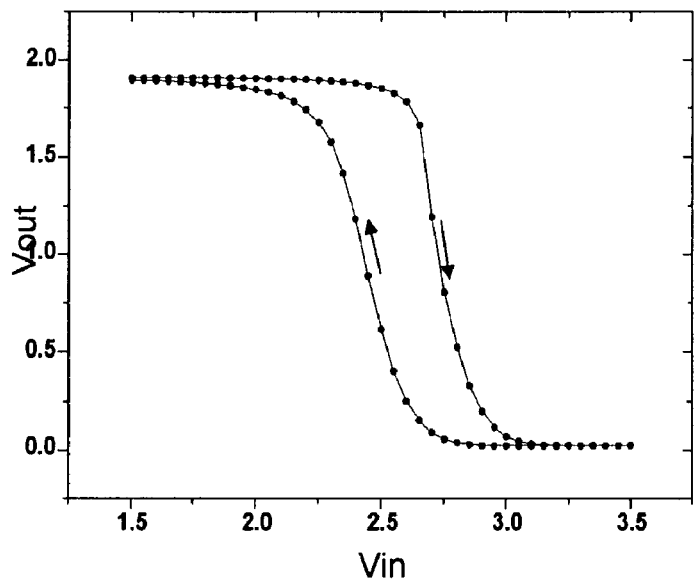
FIG. 15: Diagram illustrating the Input/Output relationship for the single-stage amplifier/switch illustrated in FIG. 14.

Viewed as a p-channel device, we can now construct a single stage amplifier 1400 or switch as shown in FIG. 14. The amplifier 1400 comprises an electrochemical transistor 1401 and a resistor 1402. A low input will keep the transistor in a conducting state and the output will approach the supply voltage. How close it will get depends on the ratio between the load resistor and the remaining transistor resistance. FIG. 15 shows the input/output relation (transfer function) for a supply voltage of 2 V. As is seen, the input has to be above this level before we reach a suitable working point. This is in accordance with the second design rule above. The small-signal (differential) amplification reaches values of about 10 for R=100 kohm. There is a hysteresis effect due to the difficulties of reoxidizing the transistor channel, once it has been reduced. However, some of this behavior is dynamic in the sense that lowering the sweep rate of the input voltage will yield a smaller hysteresis and a slow enough measurement is likely to eliminate the hysteresis altogether.

As the drain terminal reaches a potential close to the supply voltage simultaneously with a low gate voltage there is an obvious risk for over-oxidation of the transistor channel. In fact, the measured circuits did not allow the gate voltage to approach 0 volt before they became destroyed. Thus, to avoid this to happen, a fixed offset added to the input signal is needed. This can either be achieved through a separate battery, an additional circuitry or by chemical means.

Circuitries

In the following, a number of exemplifying circuitries will be described.

Constant Current Source

Figure 16:
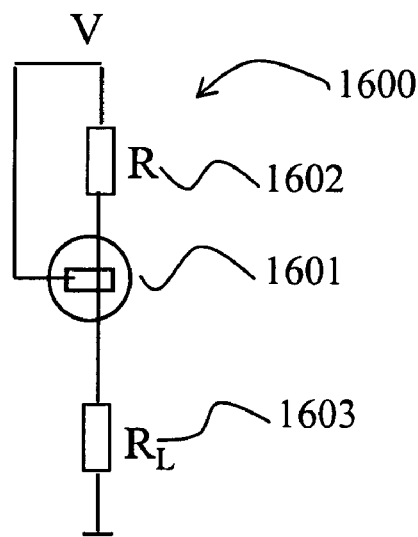
FIG. 16: Circuitry in the form of a constant current source.

FIG. 16 shows how a constant current source 1600 can be constructed based on a three-terminal transistor. The circuitry comprises an electrochemical transistor 1601, a resistor 1602, and a load resistor 1603. This circuit utilizes the fact that the I-V curves are essentially horizontal in the third quadrant. Thus, as long as the working point of the circuit lies on such a horizontal path, the current through the load will remain the same, independent on the value of the load resistor RL and the supply voltage V.

Figure 17:
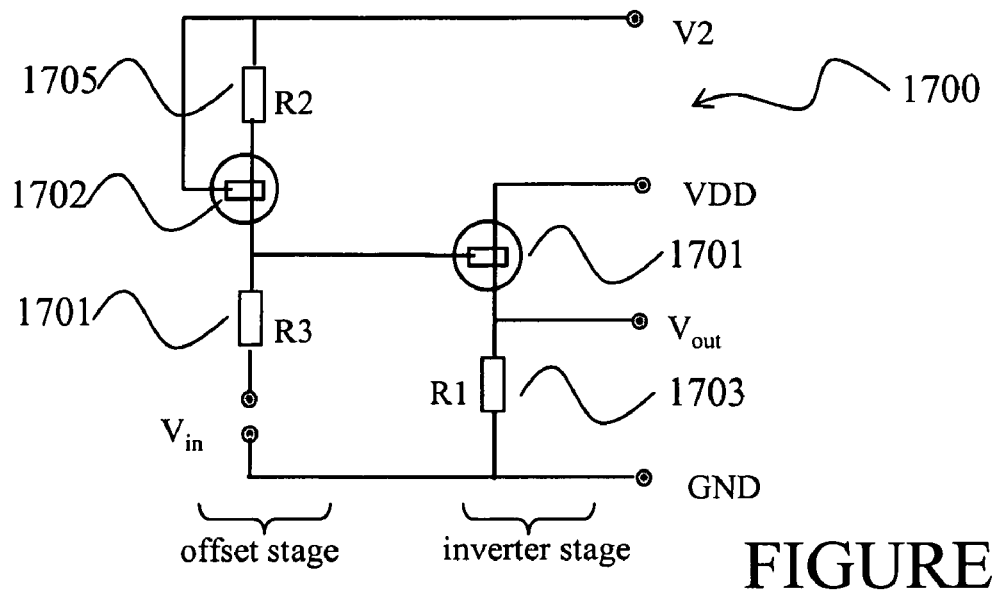
FIG. 17: Circuitry diagram for an inverter.

It is now possible to design an inverter through the use of the constant current source. This is achieved by connecting a load resistor 1701 (R3) in series with the input signal. The complete circuit is shown in FIG. 17, and further comprises a first transistor 1702, a first resistor 1703, a second transistor 1704, and a second resistor 1705. Physically, the circuit is implemented by cutting out PEDOT "islands" with a knife as described earlier. Resistors were made by slicing the PEDOT into thin serpentine "wires". The resistor values in this particular embodiment were selected as follows, R1=64 k$\Omega$, R2=16 k$\Omega$ and R3=32 k$\Omega$ and the supply voltages are V2=3.5 V, V3=1 V. The corresponding physical layout is shown in FIG. 18, where the resistors are arranged as "S-curved" resistor paths.

Figure 18:
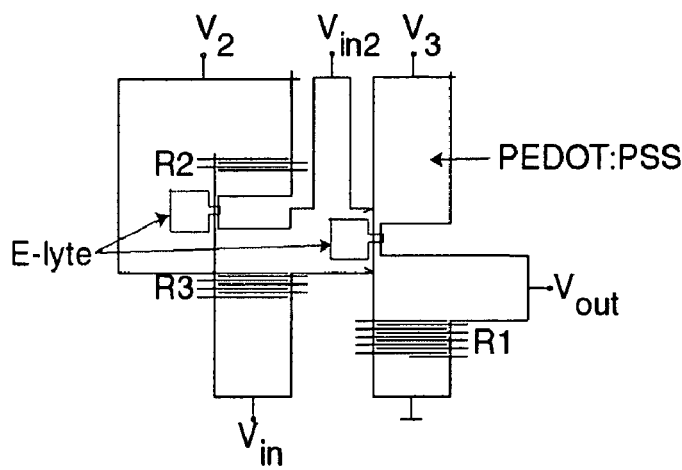
FIG. 18: Layout of the inverter circuit illustrated in FIG. 17.
Figure 19:
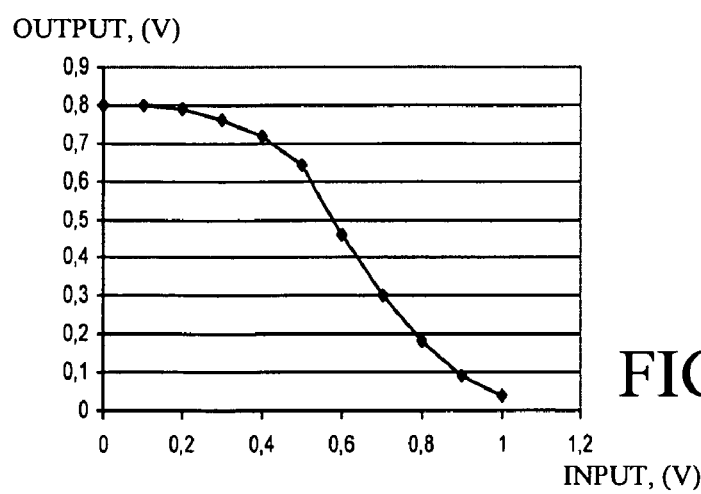
FIG. 19: Diagram illustrating the Input/Output transfer function for the inverter illustrated in FIG. 17.

The transfer function for the inverter illustrated in FIGS. 17 and 18 is given in FIG. 19. The differential gain is not as large as for the circuit in FIG. 16. The reason for this is that the value of R1 as well as the applied voltage over the switching transistor is lower compared to FIG. 16. Apart from being operative as an amplifier for small signals (centered around 0.5 volts) we can also use this device as a logical inverter. An input in the interval 0-0.2 volt (logical 0) will give an out put of 0.8 volt (logical 1) while an input of 0.8 volt or above will yield an output of 0.2 volt.

Figure 20:
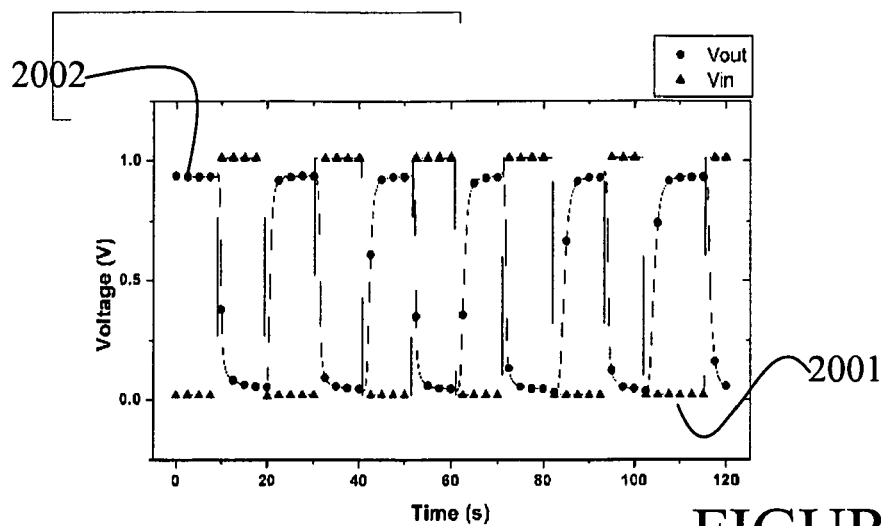
FIG. 20: Diagram illustrating the response for a binary input signal for the circuit in FIG. 17.

FIG. 20 shows the behavior for a "binary" input signal. The graph shows the input voltage (2001, Vin) and the corresponding output signal (2002, Vout). However, this particular circuit may not be the optimal choice as a basis for logic circuitry. A potential problem is that the input impedance is low. In fact a detailed analysis will show that the "fan-out" may even be lower than 1, meaning that this circuit would not be able to drive a similar circuit. Thus, new designs may be necessary to achieve reliable logical functions. Such new design will be described in the following.

Single Stage Logical Inverter

Figure 21:
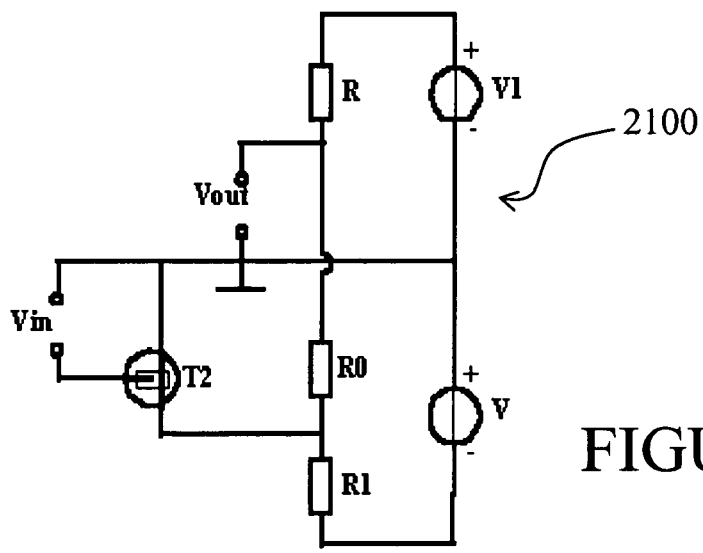
FIG. 21. Illustrates a Single stage logical inverter circuitry.
Figure 22:
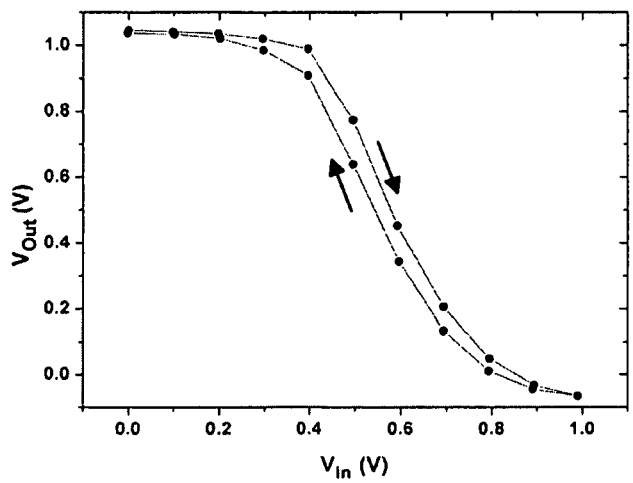
FIG. 22: Diagram illustrating the transfer function for the single stage inverter in FIG. 21.

FIG. 21 proposes a circuit 2100 for a single stage logical inverter. The input is directly connected to the transistor gate which leads to high input impedance. The transistor (T2) is biased to work in the third quadrant and generates the basic inverted signal on its drain terminal. A resistor network shifts the output signal back to the interval [0,1] used to represent the logical levels. When 1 volt is applied to the gate, the transistor (T2) is shut-off and the output level is defined by voltage division between the three resistors (R, R0, and R1) connected in series. For a 0 volt input the transistor (T2) is switched on effectively reducing the resistor network to only include the two top resistors (R and R0), now connected to ground rather than to the negative supply. The circuit requires two supply voltages (V and V1). By proper selection of resistor values the supply voltages can be chosen to be symmetric with regard to ground. Through simulations and practical evaluation has been found that V1=V=3 volt is a suitable voltage level for this circuit, and that suitable resistor values are R=80 k$\Omega$, R0=50 k$\Omega$, R1=20 k$\Omega$. FIG. 22 shows the transfer function for circuitry 2100. The upper and lower curves represent stepping-up and a stepping-down of the input voltage, respectively. This hysteresis depends to a certain degree on the sweep rate of the measuring equipment.

Figure 23:
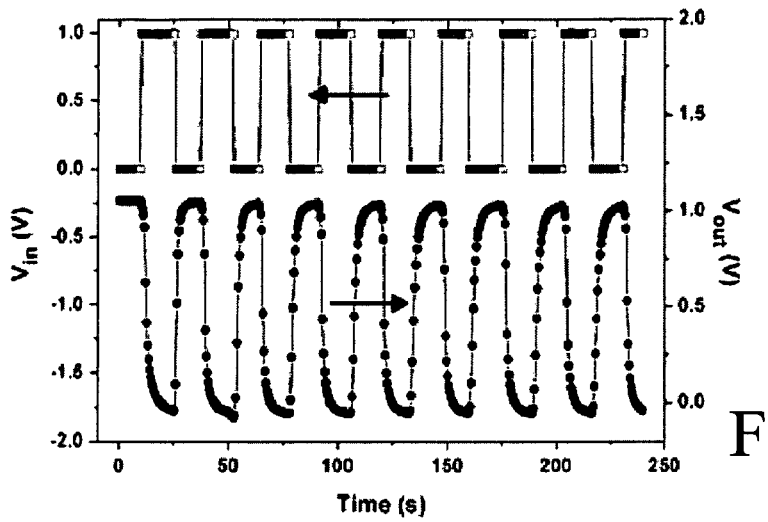
FIG. 23: Diagram illustrating the switching behavior for the single stage inverter in FIG. 21, top curve relates to the input signal (left scale) and the bottom curve relates to the output signal (right scale).

The temporal behavior of circuitry 2100 is illustrated in FIG. 23. Similar to what can be seen in FIG. 20, the leading edges are slower than the falling edges. This is due to a general property of the electrochemical transistor, namely that turn-on is much slower than turn-off. One explanation to this phenomena is that there is not a strong electric field that drives the reoxidation of the transistor channel in contrast to the reduction of the channel that takes place when a positive voltage is applied to the gate. Another, related phenomena that is observed is that the reduction front which appears on the drain side leaks a bit into the channel part that lies outside the electrolyte. This reduced part of the transistor channel will remain in low conductivity also after the rest of the channel has been reoxidized leading to a gradual decrease in performance. This effect is discussed above, and implies that the transistor channel should have a limited cross-section towards the remainder of the electrochemically active element.

Figure 24:
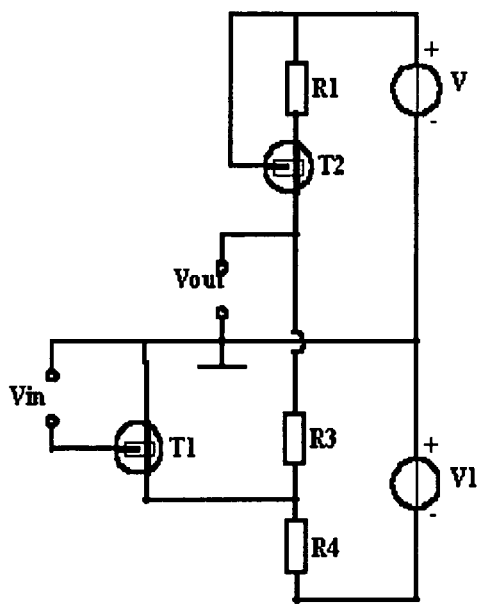
FIG. 24: Illustrates a 2-stage inverter circuitry with symmetric power supply.

By combining the basic inverter stage with the current generator mentioned previously, a circuit can be achieved that will operate at somewhat lower voltages than the single stage inverter (e.g. V=V1=2 V). Such a circuitry is shown in FIG. 24. The circuit uses the same two stages as the amplifier shown in FIG. 17 but in reversed order. The resistances may be selected as, for example: R1=17 k$\Omega$, R3=30 k$\Omega$, R4=20 k$\Omega$. The benefit is that the input impedance now becomes high and that the transfer function is somewhat steeper than for the single stage inverter as there is no resistive damping effect from the level shifting stage.

Ring Oscillator

Figure 25:
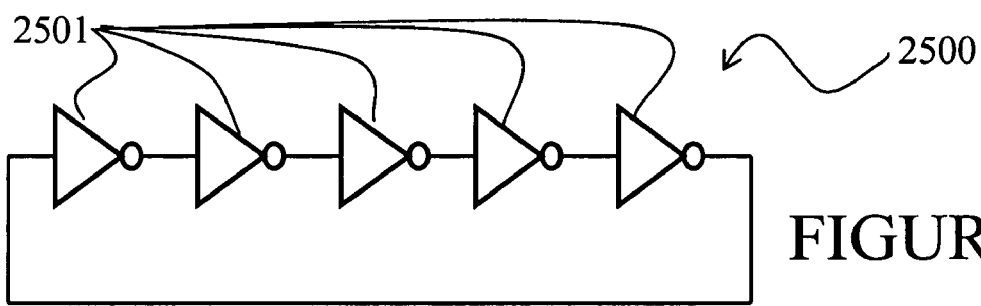
FIG. 25: Illustrates a ring oscillator circuitry.

Employing a number of inverters it is possible to arrange a ring oscillator 2500. It consists of an odd number of inverters 2501 connected to each other in a ring as shown in FIG. 25.

Figure 26:
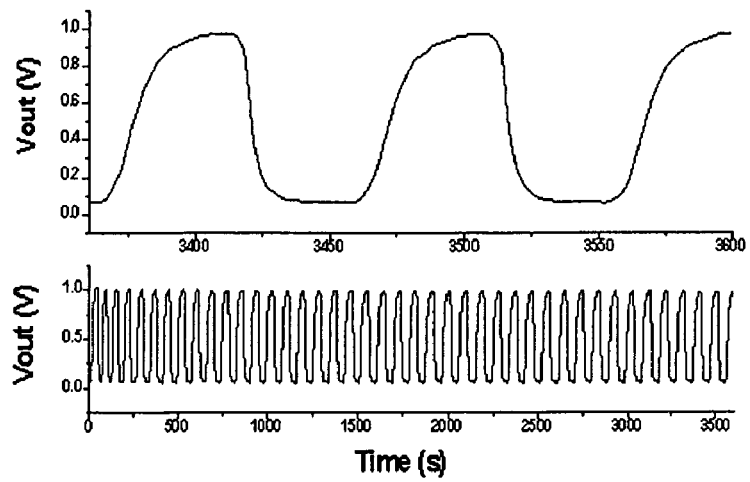
FIG. 26: Diagram illustrating the output signal of the ring oscillator shown in FIG. 25.

The minimum number of inverters to produce oscillation will depend on the amplification and phase response of the individual inverters. The ring oscillator has been a classical circuit to generate clock signals in simple digital systems. Its main use however has been for measuring the switching speed of a semiconductor technology and this is useful also in our case. With five inverters of the single-stage type shown in FIG. 21, oscillation is stable and produces well-defined logical levels. FIG. 26 shows the output from one of the inverters, both on a short time scale (top) and on a longer timescale (bottom). One full period takes about 100 s indicating that each stage has an average switching time of about 10 s. There is a slight decrease in frequency over a longer period which is visible from the bottom curve. This is likely due to the migration of reduced PEDOT mentioned earlier that accumulates on the drain side of the transistor channels.

Logical Gates

Figure 27:
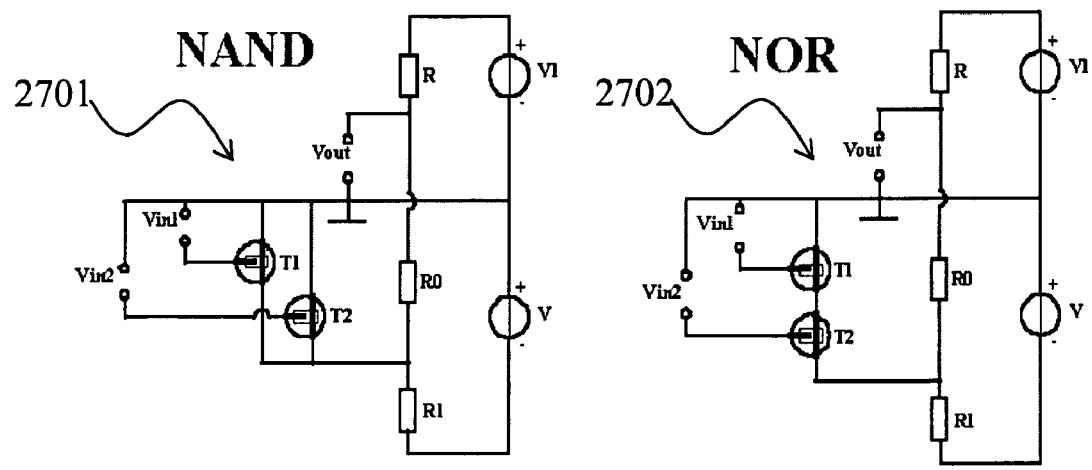
FIG. 27: Illustrates circuit diagrams of a NAND-gate (left) and a NOR-gate (right).
Figure 28:
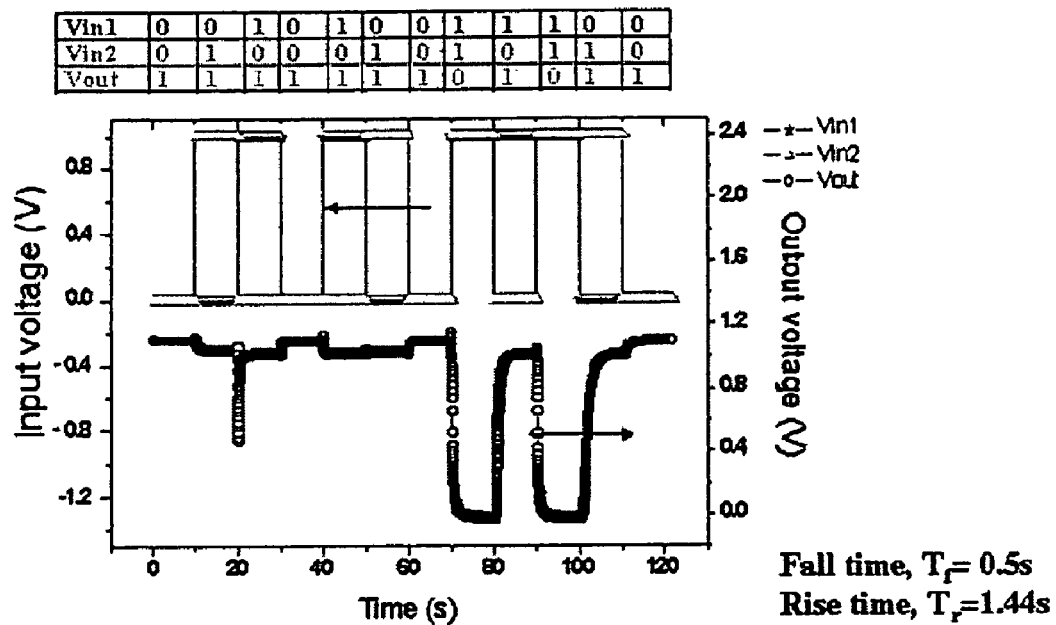
FIG. 28: Diagram illustrating output signals of the NAND-gate in FIG. 27.
Figure 29:
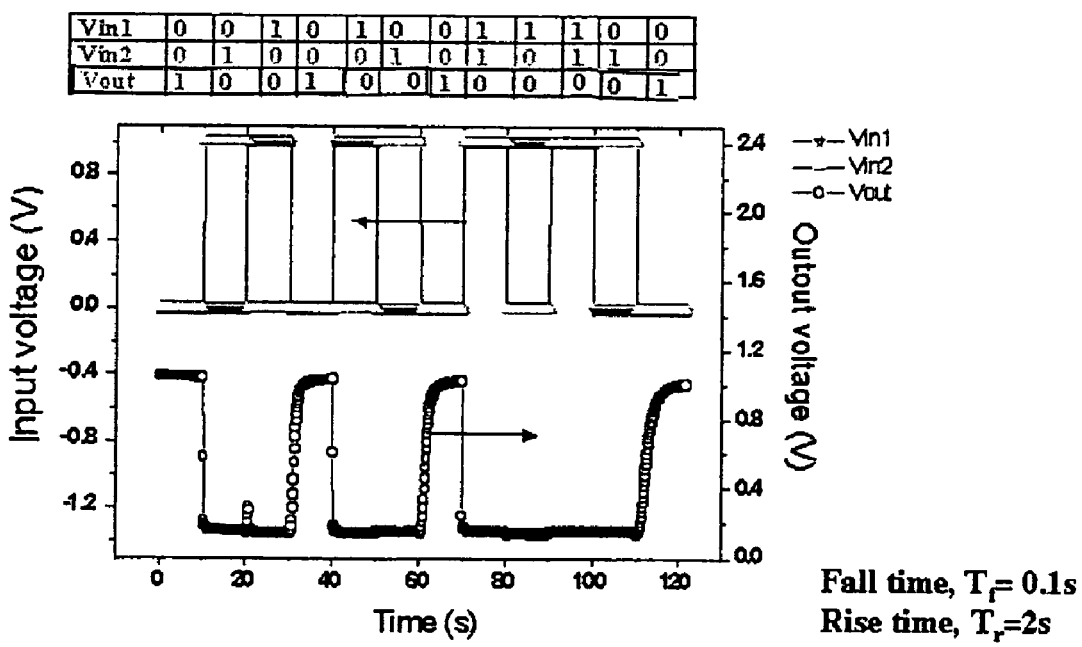
FIG. 29: Diagram illustrating the output signals of the NOR-gate in FIG. 27.

Logical gates such as NAND- and NOR-gates can be implemented as simple extensions of the inverters, as illustrated in FIG. 27. By using two transistors in parallel instead of the single input transistor, both gates must be at a high potential to generate a low output value, thus a 2-input logical NAND function 2701 is achieved. Likewise, transistors in series will yield a NOR function 2702. Examples of input/output relations for the NAND and the NOR gate are shown in FIGS. 28 and 29, respectively, and relate to circuits where R1=20 kΩ, R0=50 kΩ, and R=70 kΩ. The NAND gate has a fall time Tf=0.5 s and a rise time Tr=1.44 s, and the NOR gate has a fall time Tf=0.1 s and a rise time Tr=2 s. It can be observed that the non-symmetry in turn-off versus turn-on time for the transistors are particularly exaggerated in the case of the NOR-gate (FIG. 29). These measurements are performed on the circuits illustrated in FIG. 27 and based on transistors having a vertical configuration. In fact, the shorter overall times for these two particular circuits are due to the use of vertical transistors instead of lateral transistors in the Obviously, AND and OR gates are readily provided, for example, by adding an inverter to a NAND or NOR gate, respectively.

Analogue Amplifier

Figure 30:
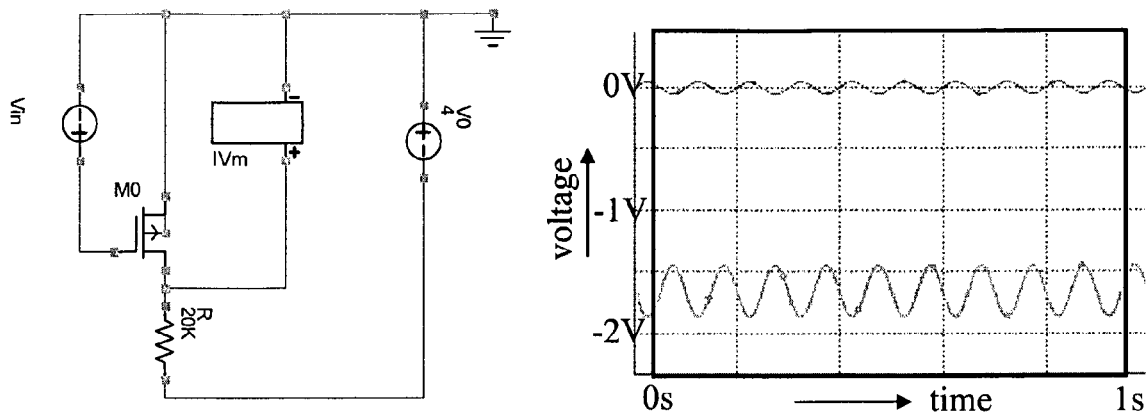
FIG. 30: Circuit diagram (right) and response curve (right) for an analogue amplifier.

An example of an analogue circuit is given in FIG. 30 (left), in the form of a basic analogue amplifier. The circuit comprises a transistor M0, a constant current source IVm, and a resistance R at 20 kΩ. The constant current source may, for example be designed as described above with reference to FIG. 16. That particular constant current source 1600 may be used also in the circuitries described below where such a component is needed.

On right, graphs showing the response modulated in SPICE is given, the upper graph relates to the input voltage (Vin), and the lower graph relates to the output voltage (V0).

Single Stage AC-Bypassed Amplifier

Figure 31:
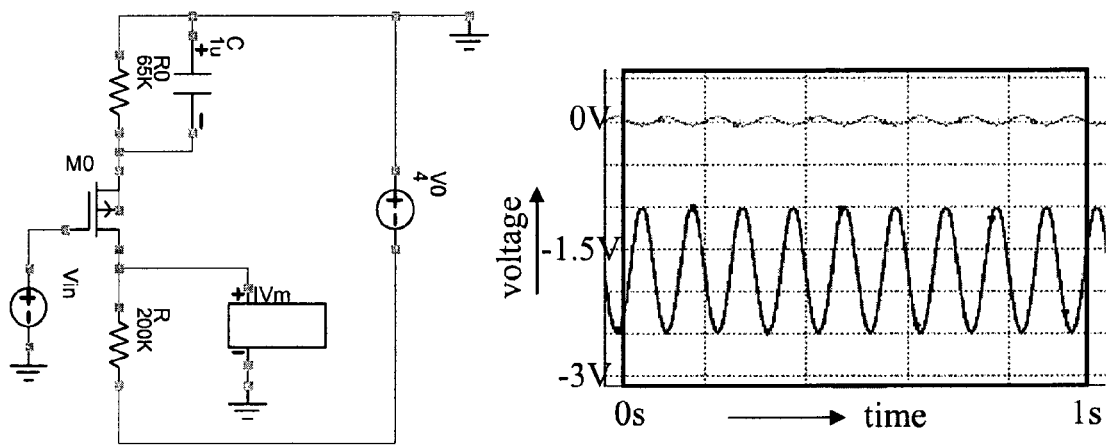
FIG. 31: Circuit diagram (right) and response curve (right) for a single stage AC-bypassed amplifier.

Another analogue circuit is illustrated in FIG. 31 (left), in the form of a single stage AC-bypassed amplifier. The circuit comprises a transistor M0, two resistors (R at 200 kΩ and R0 at 65 kΩ), a constant current generator IVm, and a capacitor C=1 uF. The capacitor may be formed out of organic material as well, for example in line with the teachings in the article "All-polymer RC filter circuits fabricated with inkjet printing technology", Chen at el, Solid-State Electronics 47 (2003) 841-847.

On right, graphs showing the response modulated in SPICE is given. The upper graph relates to the input voltage (Vin), and the lower graph relates to the output voltage (V0).

Differential Amplifier

Figure 32A:
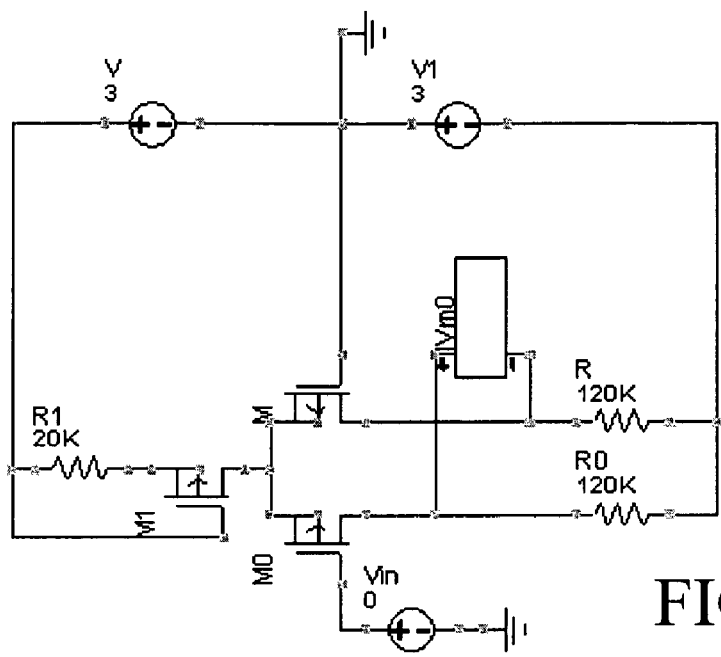
FIG. 32a: Circuit diagram for a differential amplifier.

FIG. 32*a* illustrates a differential amplifier that comprises two transistors M and M0; three resistors R=120 kΩ, R0=120 kΩ, and R1=20 kΩ; a constant current source IVm0; and a feed voltage V1=3 V.

Figure 32B:
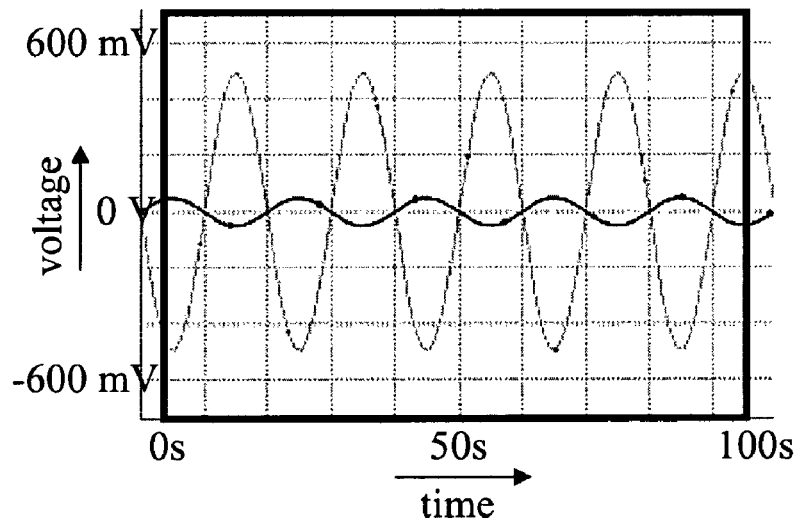
FIG. 32b: Diagram showing the response of the differential amplifier in FIG. 32a when driven with AC voltage.

FIG. 32*b* illustrates the AC characteristics of the differential amplifier. The graph having the highest amplitude is, of course, the voltage response and the other graph represents the input voltage.

Figure 32C:
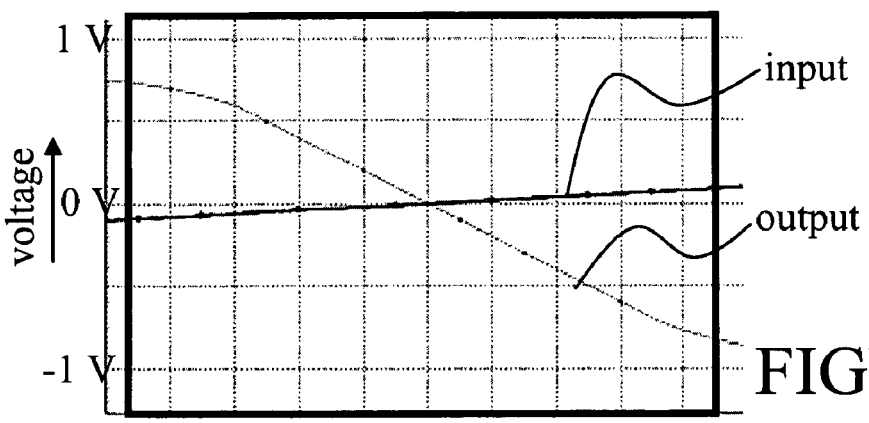
FIG. 32c: Diagram showing the response of the differential amplifier in FIG. 32a when driven with DC voltage.

FIG. 32*c* illustrates the DC characteristics of the differential amplifier. The slowly increasing graph relates to the input voltage and the more rapidly decreasing graph relates to the output voltage.

"High Gain" Amplifier

Figure 33A:
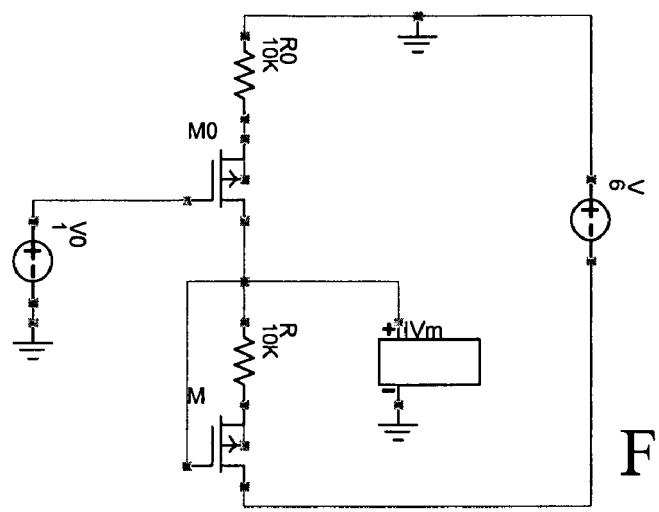
FIG. 33a-b: Circuit diagram (FIG. 33a) and response curve (FIG. 33b) for a "high gain" amplifier.

FIG. 33*a* illustrates a "high gain" amplifier, comprising two resistors R=R0=10 kΩ, two transistors M and M0, and a constant current source IVm.

Figure 33B:
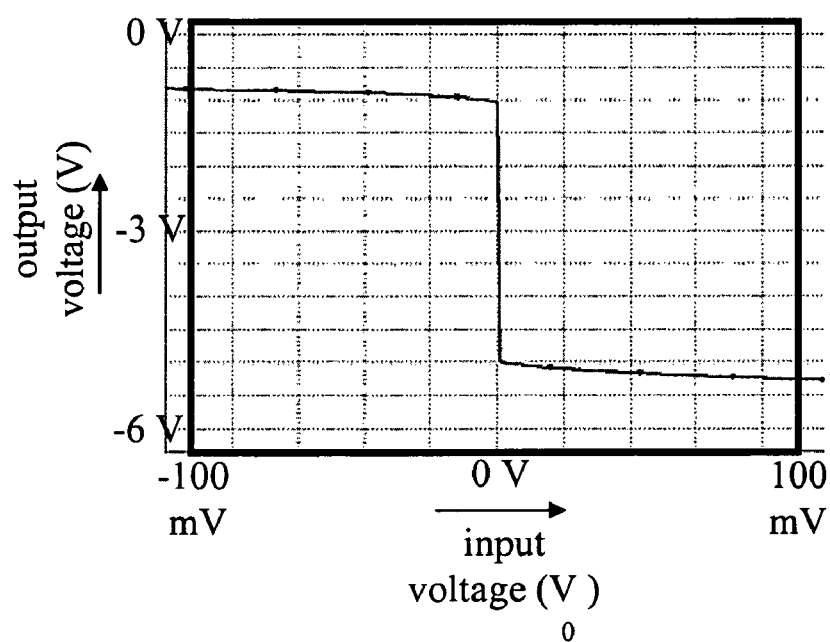

FIG. 33*b* illustrates the response of the "high gain" amplifier, input voltage versus output voltage. The amplifier exhibits a clear step-function at an input of 0 V.

Drivers

Various high fan-out drive circuits can also be provided. High fan-out drive circuits are useful e.g. for providing clock signals. Some examples of high fan-out drivers are given below.

Figure 34A:
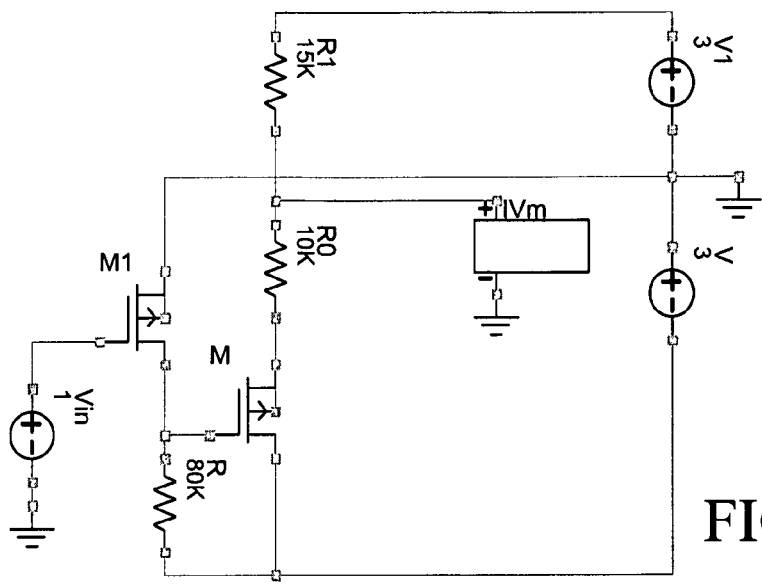
FIG. 34a-b: Circuit diagram (FIG. 34a) and response curve (FIG. 34b) for a power inverter.
Figure 34B:
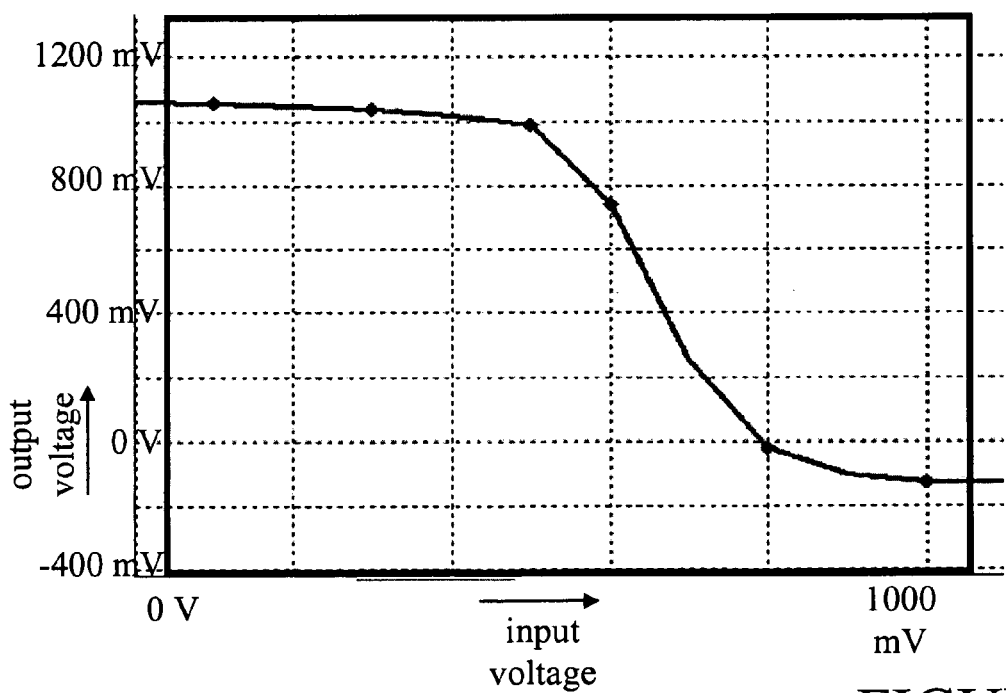

FIG. 34*a*, for example, illustrates a power inverter that comprises three resistors R=80 kΩ, R0=10 kΩ, and R1=15 kΩ; two transistors M and M1, a constant current source IVm; and a feed voltage V=3 V. FIG. 34*b* illustrates output versus input voltages for the inverter.

Figure 35A:
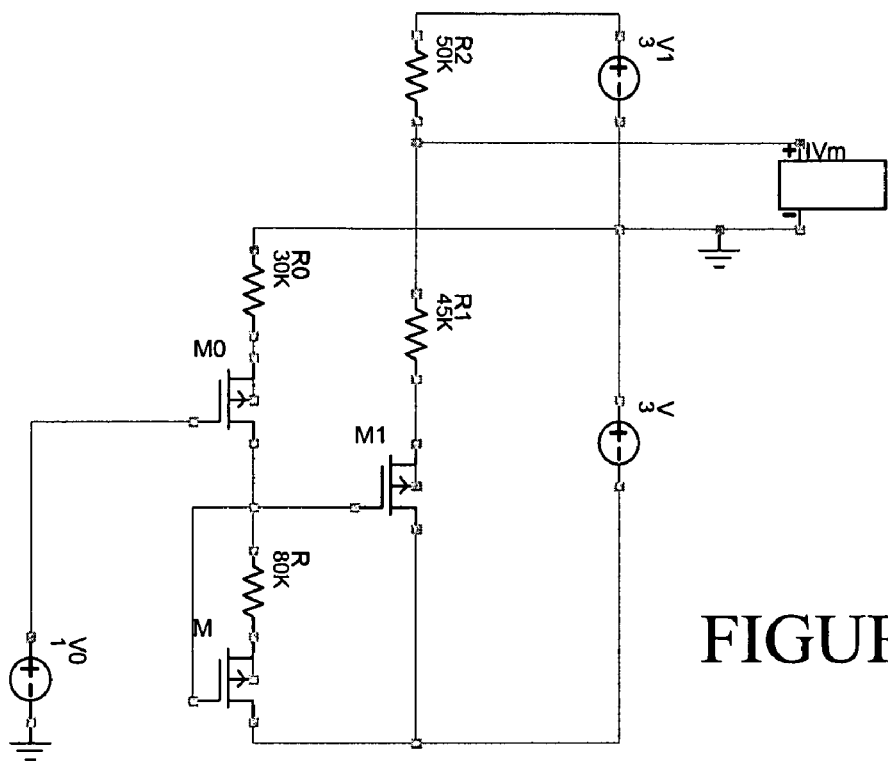
FIG. 35a-b: Circuit diagram (FIG. 35a) and response curve (FIG. 35b) for a "high gain" inverter.
Figure 35B:
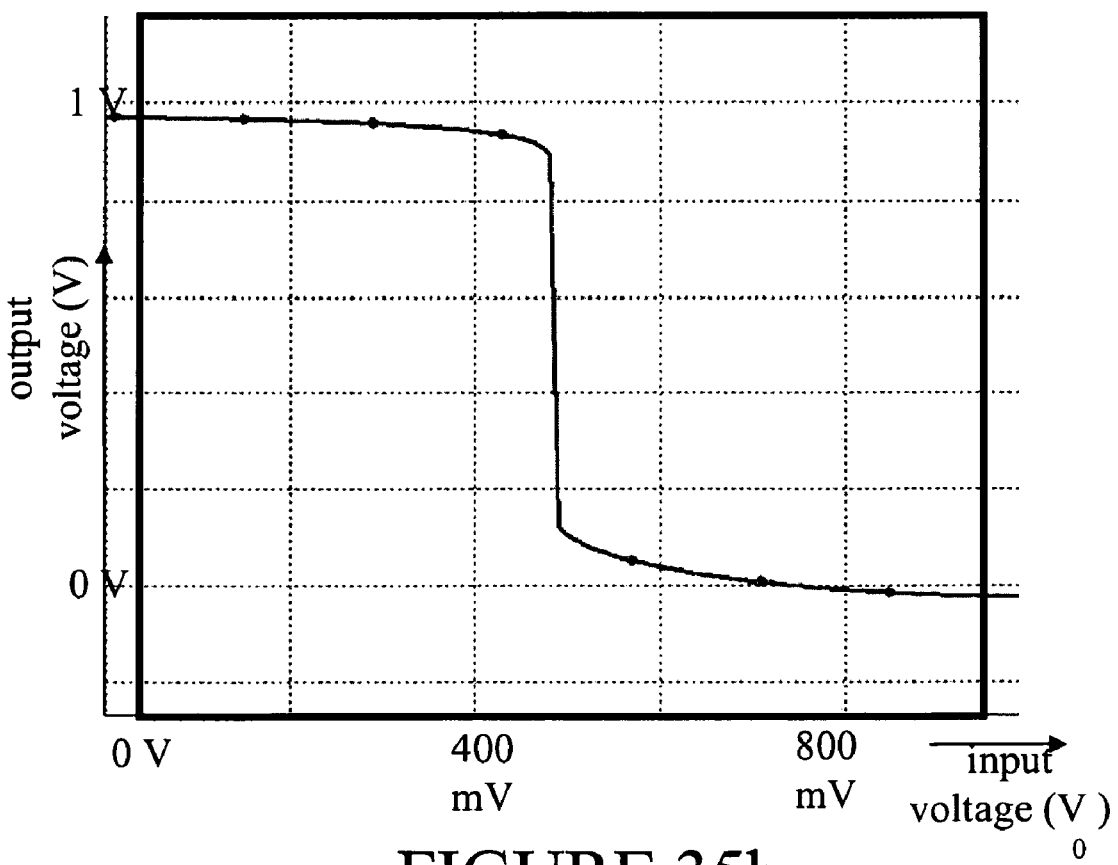
Figure 36A:
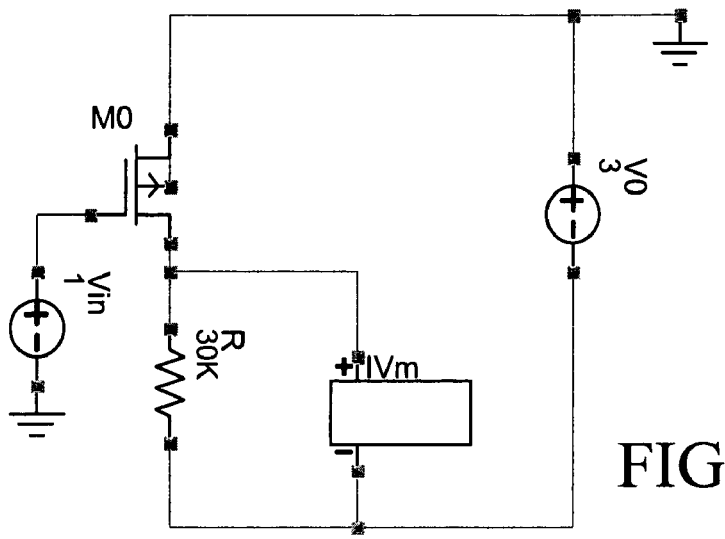
FIG. 36a-b: Circuit diagram (FIG. 36a) and response curve (FIG. 36b) for a first pixel driver.
Figure 36B:
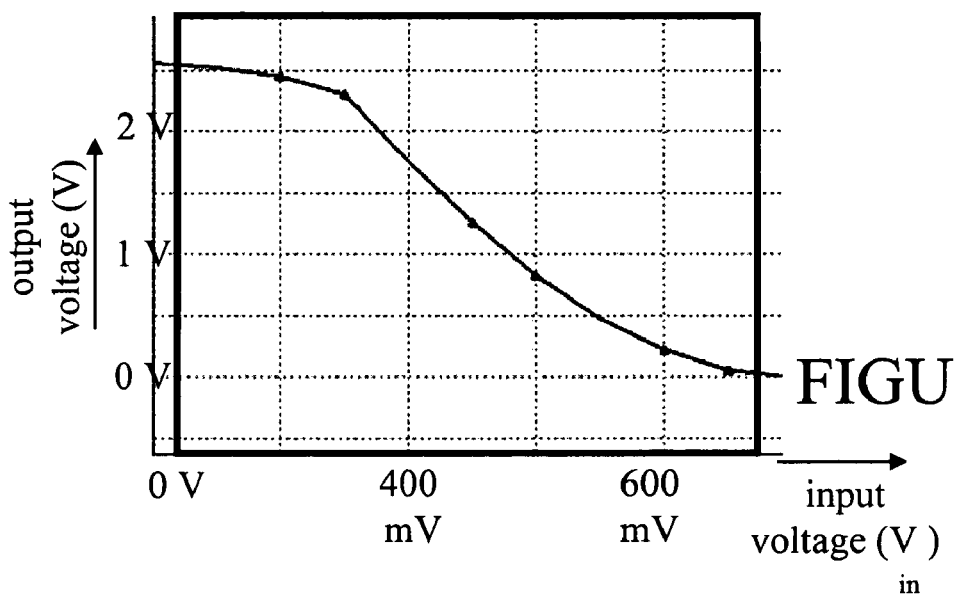
Figure 37A:
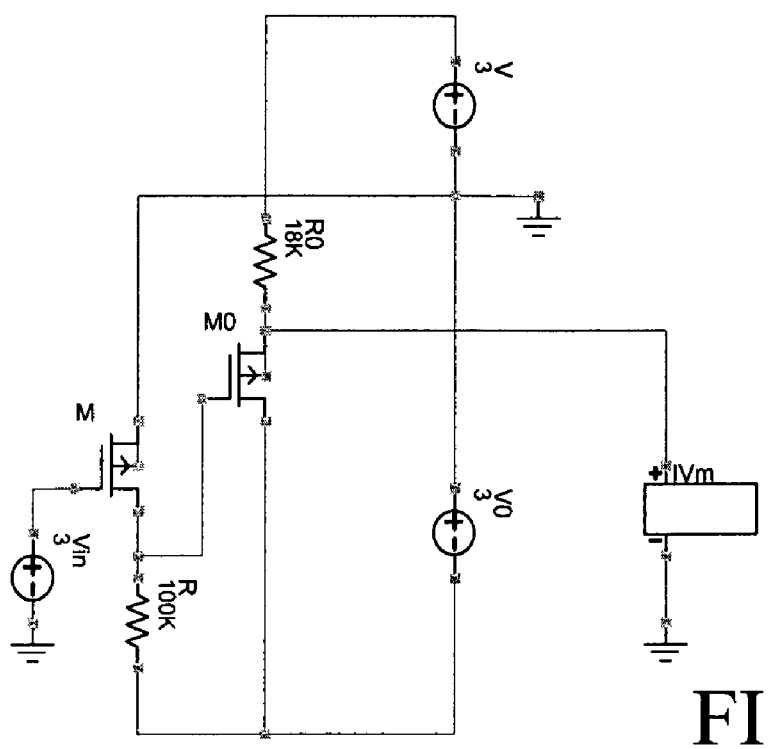
FIG. 37a-b: Circuit diagram (FIG. 37a) and response curve (FIG. 37b) for a second pixel driver.
Figure 37B:
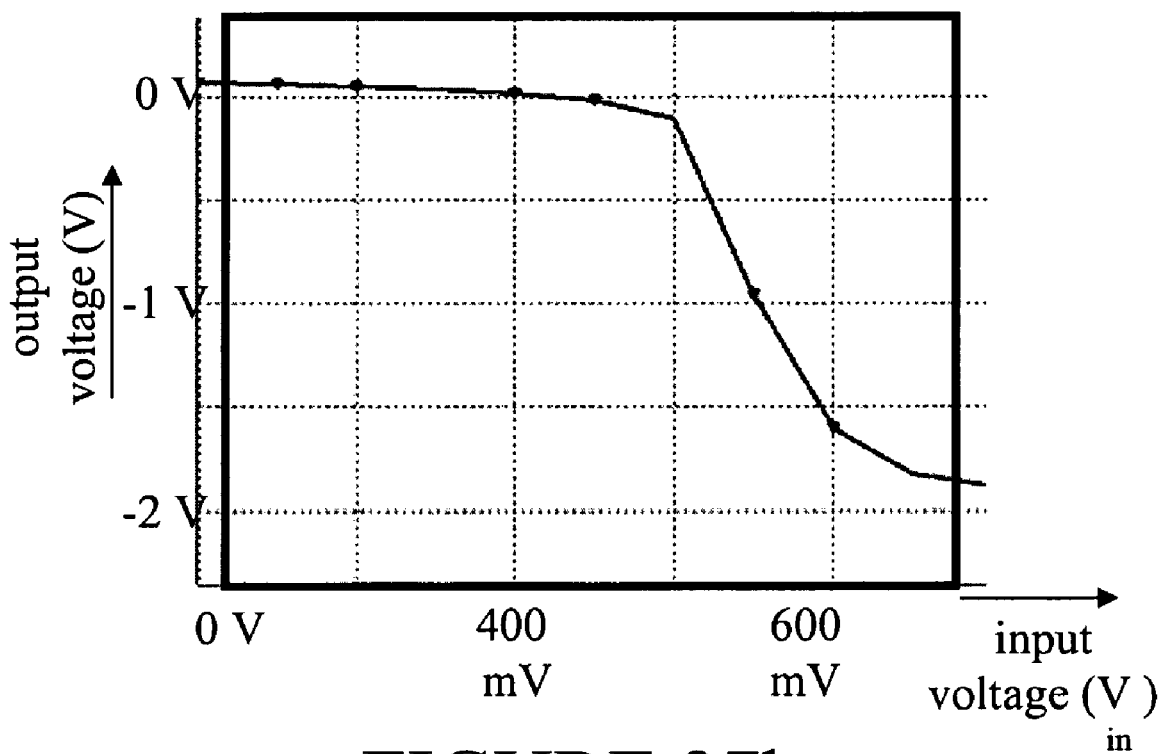

FIG. 35*a* illustrates a "high gain" inverter that comprises four resistors R=80 kΩ, R0=30 kΩ, R1=45 kΩ, and R2=50 kΩ; three transistors M, M0, and M1; a constant current source IVm; and a feed voltage V=3 V. FIG. 35*b* illustrates input versus output voltages for the "high gain" inverter. It is also possible to design pixel drivers for use in displays. Such driver must be capable of translating logic levels to appropriate signal levels. For example, electrochromic display cells typically need at least 0.8-1 V swing (i.e. the voltage needed across the pixel cell to make it change appearance). FIG. 36*a* illustrates one possible pixel driver that comprises one resistor R=30 kΩ, one transistor M0, and one constant current source IVm. The response of this circuit is illustrated in FIG. 36*b*. An alternative pixel driver is illustrated in FIG. 37*a*, and comprises two resistors R=1000 kΩ and R0=18 kΩ; two transistors M and M0; one constant current source IVm; and a feed voltage V=3 V. The response from this somewhat more complex pixel driver is illustrated in FIG. 37*b*, where the output voltage is plotted as a function of the input voltage.

Figure 38A:
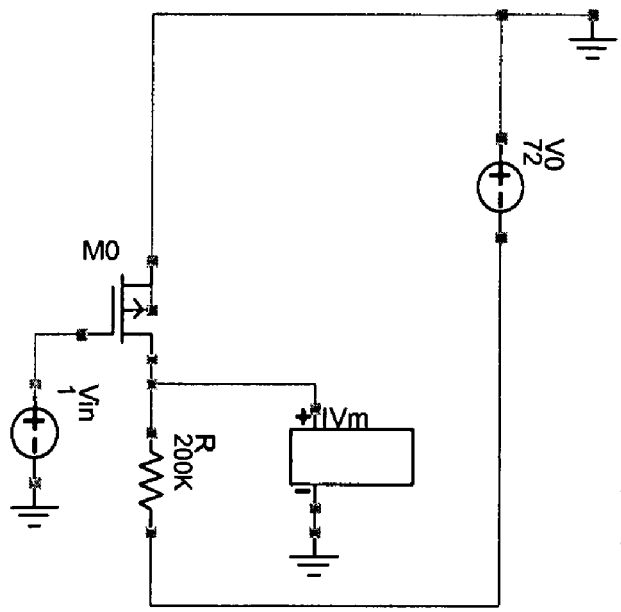
FIG. 38a-b: Circuit diagram (FIG. 38a) and response curve (FIG. 38b) for a high voltage driver.
Figure 38B:
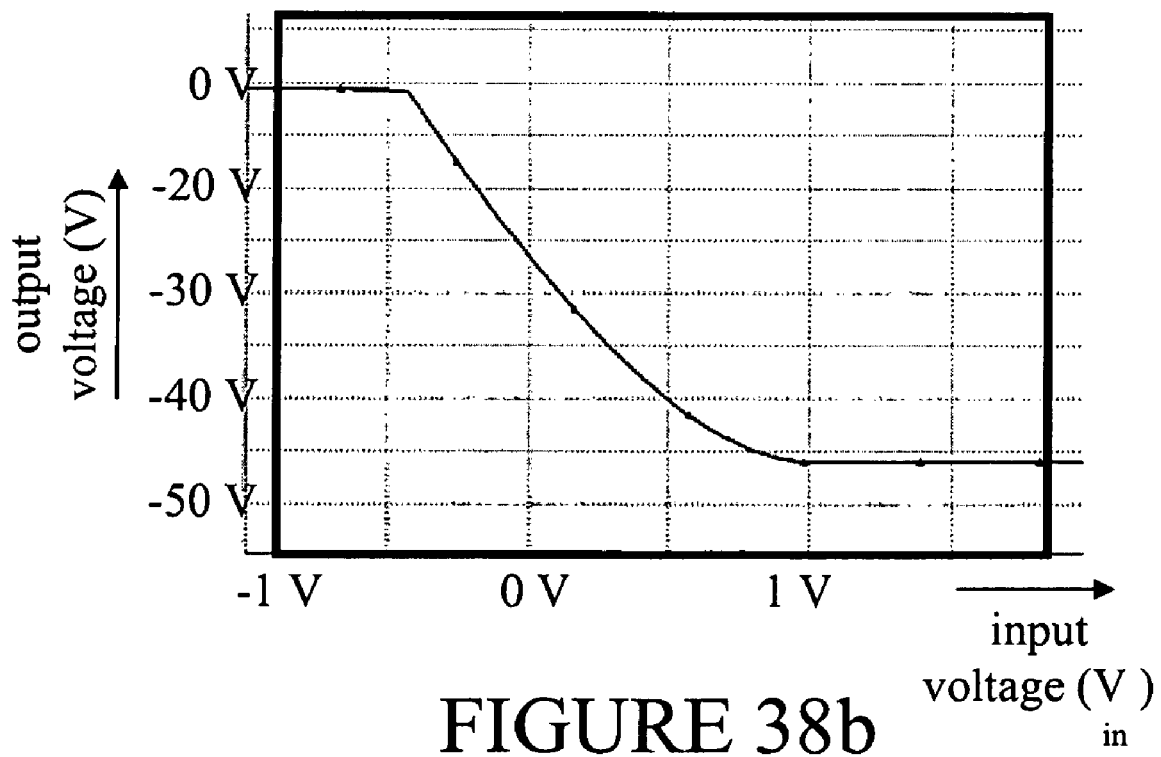

FIG. 38*a* illustrates a high voltage driver that comprises one resistor R=200 kΩ, one transistor M0, and one constant current source IVm. This driver is capable of providing a substantially higher drive voltage, as is seen from the graph of FIG. 38*b*. An input voltage ranging between −1 V and 1 V gives an output voltage ranging between 0 V and ≈−46 V.

In addition, circuits including for example sensors, batteries, capacitors, and display elements may be provided. In essence, it has been found that the electrochemical transistor can be used in circuits similar to those of as ordinary solid-state transistors as long as the particular biasing required by the electrochemical transistor is taken into account.

The invention claimed is:

1. A method of producing an electrochemical transistor device comprising the steps of:
   providing a flexible substrate;
   arranging a layer of organic material on said substrate, which material has the ability of electrochemically altering its electrical conductivity through change of redox state thereof;
   providing a gate electrode of electrically conductive material spatially separated from said layer of organic material;
   arranging a solidified electrolyte in direct electrical contact a with at least a portion of said gate electrode;
   arranging said solidified electrolyte in direct electrical contact with, and covering, only a portion of said layer of organic material, such that the layer of organic material comprises a source contact, a drain contact and an electrochemically active element having a transistor channel arranged between and electrically connecting said source and drain contacts, such that current between said source contact and drain contact is controllable by means of a voltage applied to said gate electrode.

2. A method according to claim 1, wherein the step of arranging said solidified electrolyte in direct electrical contact with, and covering, only a portion of said layer of organic material further comprises the step of covering only a portion of said layer of organic material with an ion isolative material, such that said ion isolative material is sandwiched between said layer of organic material and said solidified electrolyte.

3. A method according to claim 1, wherein said step of arranging the solidified electrolyte in direct electrical contact with said electrochemically active element comprises arranging said electrolyte in direct electrical contact with the entire cross-section of said organic material between said source and drain contacts.

4. A method according to claim 1, wherein the step of arranging said layer of organic material on said substrate further comprises the step of arranging said layer by means of printing, such as screen printing or ink-jet printing.

5. A method according to claim 1, wherein said step of arranging said gate electrode further comprises a step of sandwiching said solidified electrolyte between said gate electrode and said electrochemically active element.

6. A method according to claim 1, wherein said step of arranging said gate electrode further comprises a step of arranged it to the side of said electrochemically active element.

7. A method of producing an electrochemical transistor device comprising the steps of:
   providing a source contact and a drain contact,
   providing an electrochemically active element between and in direct electrical contact with said source contact and said drain contact, wherein the element is arranged of organic material which has the ability to electrochemically altering its electrical conductivity through change of redox state thereof;
   providing a gate electrode of electrically conductive material, which is spatially separated from said source and drain contacts as well as said electrochemically active element;
   covering only a portion of said electrochemically active element with an ion isolative material;
   arranging a solidified electrolyte in direct electrical contact with at least a portion of said gate electrode and in direct electrical contact with a portion of said electrochemically active element free of said ion isolative material, such that current between said source contact and drain contact is controllable by means of a voltage applied to said gate electrode.

8. A method according to claim 7, wherein the step of arranging said electrolyte comprises covering a portion of said ion isolative material, such that the ion isolative material is sandwiched between said solidified electrolyte and said electrochemically active material.

9. A method according to claim 7, wherein said ion isolative material is arranged as a layer.

10. A method according to claim 9, wherein said ion isolative layer comprises a recess.

11. A method according to claim 7, wherein said step of arranging the electrochemically active element comprises arranging said element on a support.

12. A method of producing an electrochemical device comprising the steps of:
   providing a flexible support comprising paper or plastic or combinations thereof;
   arranging a layer of electrochemically active material on said support, wherein the material is organic and has the ability to electrochemically altering its electrical conductivity through change of redox state thereof;
   providing a first electrode of electrically conductive material in direct electrical contact with said layer of electrochemically active material;
   providing a gate electrode of electrically conductive material, which is spatially separated from said electrochemically active material;
   arranging a ion isolative material such that it covers only a portion of said electrochemically active element;
   arranging a solidified electrolyte in direct electrical contact with at least a portion of said gate electrode and in direct electrical contact with a portion of said electrochemically active element free of said ion isolative material, such that a color of said electrochemically active material is controllable by means of a voltage applied to said gate electrode.

13. A method according to claim 12, wherein the step of arranging said solidified electrolyte comprises a step of covering at least a portion of said ion isolative material, such that the ion isolative material is sandwiched between said layer of organic material and said solidified electrolyte.

14. A method of producing a circuitry having electrochemical transistor(s) comprising the steps of:
   providing a substrate;
   providing several sets of potential transistors on said substrate, each set comprising:
      a source contact of electrically conductive material,
      a drain contact of electrically conductive material,
      an electrochemically active element arranged between, and in direct electrical contact with, the source and drain contacts, which element is arranged of organic material and has the ability to electrochemically altering its electrical conductivity through change of redox state thereof; and
      a gate contact of electrically conductive material;
   electing a first group of potential transistor sets and a second group of potential transistor sets, wherein each transistor set is either part of said first or said second group;
   arranging, for each potential transistor of said first group, solidified electrolyte in direct electrical contact with at least a portion of the gate electrode and at least a portion of the electrochemically active element of said potential transistor, such that current between said source contact and said drain contact, in direct electrical contact with said electrochemically active element, is controllable by means of a voltage applied to said gate electrode;

completing the circuitry, wherein each electrochemically active element a potential transistor in said second group is kept free of electrolyte.

15. A method according to claim 14, further comprising a step of covering at least one of the electrochemically active element, of a potential transistor of said second group, with a layer of ion isolative material.

16. A method according to claim 14, further comprising a step of covering the electrochemically active element of each potential transistor of said second group with a layer of ion isolative material, before the step of arranging said solidified electrolyte, to prevent direct electrical contact between the solidified electrolyte and the electrochemically active element of potential transistors in said second group.

17. A method according to claim 14, further comprising the step of covering only a portion of the electrochemically active element of a potential transistor of said first group with a layer of ion isolative material, before the step of arranging said solidified electrolyte.

18. A method according to claim 15, further comprising the step of arranging the electrolyte with a low degree of precision.

19. A method according to claim 14, wherein said substrate is flexible and arranged of paper or plastic or combinations thereof.

20. A method according to claim 16, further comprising the step of arranging the electrolyte with a low degree of precision.

21. A method according to claim 17, further comprising the step of arranging the electrolyte with a low degree of precision.

22. An electrochemical transistor device comprising:

a source contact and a drain contact;

an electrochemically active element between and in direct contact with said source contact and said drain contact, wherein the element is arranged of organic material which has the ability to electrochemically altering its electrical conductivity through change of redox state thereof;

a gate electrode of electrically conductive material, which is spatially separated from said source and drain contacts as well as said electrochemically active element;

a solidified electrolyte in direct electrical contact with at least a portion of said gate electrode and in direct electrical contact with a portion of said electrochemically active element such that current between said source contact and drain contact is controllable by means of a voltage applied to said gate electrode;

ion isolative material, sandwiched between said electrochemically active element and said solidified electrolyte, such that it defines said transistor channel.

23. A transistor device according to claim 22, wherein said transistor has a vertical structure.

24. A transistor device according to claim 23, wherein said solidified electrolyte is sandwiched between said gate electrode and said electrochemically active element.

25. A transistor device according to claim 22, wherein said transistor has a lateral structure.

26. A transistor device according to claim 25, wherein said gate electrode is arranged to the side of said electrochemically active element.

27. A transistor device according to claim 22, wherein said transistor device is arranged on a flexible substrate arranged of a material selected from a group comprising paper, plastic and combinations thereof.

* * * * *